United States Patent
Umezaki et al.

(10) Patent No.: US 8,836,686 B2
(45) Date of Patent: Sep. 16, 2014

(54) DISPLAY DEVICE

(75) Inventors: Atsushi Umezaki, Isehara (JP); Hiroyuki Miyake, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 750 days.

(21) Appl. No.: 13/044,130

(22) Filed: Mar. 9, 2011

(65) Prior Publication Data

US 2011/0221734 A1 Sep. 15, 2011

(30) Foreign Application Priority Data

Mar. 12, 2010 (JP) ................................. 2010-056464

(51) Int. Cl.
G09G 5/00 (2006.01)

(52) U.S. Cl.
USPC .......................................................... 345/211

(58) Field of Classification Search
None
See application file for complete search history.

(56) References Cited

U.S. PATENT DOCUMENTS

| | | | |
|---|---|---|---|
| 5,767,832 | A | 6/1998 | Koyama et al. |
| 7,880,503 | B2 * | 2/2011 | Kwon et al. ..................... 326/83 |
| 8,269,714 | B2 * | 9/2012 | Furuta et al. .................. 345/100 |
| 2007/0040792 | A1 | 2/2007 | Kwag et al. |
| 2008/0055225 | A1 | 3/2008 | Pak et al. |
| 2010/0134476 | A1 | 6/2010 | Zebedee et al. |
| 2010/0141642 | A1 | 6/2010 | Furuta et al. |

FOREIGN PATENT DOCUMENTS

| | | |
|---|---|---|
| CN | 1116756 | 2/1996 |
| CN | 101681682 | 3/2010 |
| CN | 101779252 | 7/2010 |
| EP | 2189988 A | 5/2010 |
| JP | 07-239463 A | 9/1995 |
| JP | 2007-004176 | 1/2007 |
| JP | 2008-058939 | 3/2008 |
| JP | 2008-287134 A | 11/2008 |
| JP | 2010-527092 | 8/2010 |
| KR | 10-0319221 B | 1/2002 |
| WO | WO-2009/028716 | 3/2009 |
| WO | WO-2009/034750 | 3/2009 |

OTHER PUBLICATIONS

International Search Report (Application No. PCT/JP2011/054059) Dated May 31, 2011.
Written Opinion (Application No. PCT/JP2011/054059) Dated May 31, 2011.
Harada et al., "Low Power LC Display Using In—Ga—Zn—Oxide TFTs Based on Variable Frame Frequency and Partial Scan," AM-FPD '10 Digest of Technical Papers, Jul. 5, 2010, pp. 199-202.

* cited by examiner

*Primary Examiner* — Jason Olson
(74) *Attorney, Agent, or Firm* — Eric J. Robinson; Robinson Intellectual Property Law Office, P.C.

(57) ABSTRACT

To provide a display device in which rewriting of only a given section of an image can be achieved or to simplify the configuration of a circuit including wirings in a display device in which partial driving can be performed. A shift of a selection signal in a shift register included in a scan line driver circuit and supply of a selection signal to scan lines are controlled independently of each other, so that rewriting of only a given section of an image can be achieved. The above operation is realized by providing a wiring that supplies a signal representing a clock signal or a fixed potential. Therefore, the configuration of the circuit including the wiring can be simplified in the display device including the wiring while partial driving can be performed.

23 Claims, 16 Drawing Sheets
(1 of 16 Drawing Sheet(s) Filed in Color)

DISPLAY DEVICE

TECHNICAL FIELD

The present invention relates to a display device.

BACKGROUND ART

Display devices in which only part of an image is rewritten so that power consumption can be reduced have been developed. Such a display device includes a scan line driver circuit with which only some of scan lines can be driven (such driving can be referred to as partial driving) in order to rewrite part of an image.

Patent Document 1 discloses a scan line driver circuit (a gate driver) that can realize partial driving. Specifically, the scan line driver circuit (the gate driver) disclosed in Patent Document 1 is divided into a plurality of groups. Operations of the plurality of groups divided are controlled with different start pulses (scan start signals). That is, the scan line driver circuit (the gate driver) in Patent Document 1 realizes partial driving by controlling start pulses (scan start signals) input to each group.

REFERENCE

Patent Document 1: Japanese Published Patent Application No. 2007-004176

DISCLOSURE OF INVENTION

However, in the display device disclosed in Patent Document 1, which section of an image is rewritten is selected only by groups already divided. That is, rewriting of an image for a given scan line (e.g., per scan line) cannot be selected. Furthermore, in the display device disclosed in Patent Document 1, the number of signals necessary for driving the scan line driver circuit is increased in accordance with the number of divided groups of the scan line driver circuit. That is, the number of wirings included in the scan line driver circuit is increased in accordance with the number of groups. Moreover, when the scan line driver circuit is formed over a substrate where a pixel portion is formed, the number of connections between the substrate where the pixel portion is formed and an external circuit is increased in accordance with the number of groups.

In view of the foregoing problems, an object of one embodiment of the present invention is to provide a display device in which rewriting of only a given section of an image can be achieved. Moreover, an object of one embodiment of the present invention is to simplify the configuration of a circuit including wirings in a display device in which partial driving can be realized. Note that one embodiment of the present invention achieves at least one of the above objects.

The above object can be achieved in such a manner that a scan line driver circuit selectively supplies a selection signal to a plurality of scan lines. For example, in the case where the scan line driver circuit includes a shift register constituted by a plurality of pulse output circuits, a selection signal can be selectively supplied to a plurality of scan lines with the following structure: each of the pulse output circuits shifts a selection signal to the subsequent-stage pulse output circuit by using a clock signal, and supplies a signal to the scan line by selectively using the clock signal and a fixed potential. In other words, supply of a selection signal to the scan line can be controlled with such a design that a selection signal is input to the scan line when a clock signal is used, and a non-selection signal is input to the scan line when a fixed potential is used.

Specifically, according to one embodiment of the present invention, a display device includes a plurality of pixels of m rows and n columns; first to m-th scan lines electrically connected to n pixels in respective first to m-th rows, among the plurality of pixels; and first to m-th pulse output circuits electrically connected to the respective first to m-th scan lines. The k-th pulse output circuit (k is a natural number greater than or equal to 2 and less than m) includes a first transistor having one of a source and a drain electrically connected to a wiring supplying a clock signal, and the other of the source and the drain electrically connected to the (k+1)th pulse output circuit; a second transistor having one of a source and a drain electrically connected to a wiring supplying the clock signal or a fixed potential, and the other of the source and the drain electrically connected to the k-th scan line; and a control circuit configured to control a potential of a gate of the first transistor and a potential of a gate of the second transistor in accordance with a signal input from the (k−1)th pulse output circuit.

Note that in this specification and the like, explicit singular forms preferably mean singular forms. However, the singular form can also include the plural without limitation to the above. Similarly, explicit plural forms preferably mean plural forms. However, the plural form can include the singular without limitation to the above.

In this specification and the like, the terms "first", "second," "third," and the like are used for distinguishing various elements, members, regions, layers, and areas from each other. Therefore, the terms "first", "second", "third," and the like do not limit the number of the elements, members, regions, layers, areas, or the like. Further, "first" can be replaced with "second" or "third", for example.

In the display device according to one embodiment of the present invention, a shift of a selection signal in a shift register included in a scan line driver circuit and supply of a selection signal to scan lines can be controlled independently of each other. For that reason, a selection signal can be selectively supplied to each of a plurality of scan lines. In other words, in the display device according to one embodiment of the present invention, rewriting of only a given section of an image can be achieved.

In addition, in the display device according to one embodiment of the present invention, the above-described operation can be realized by providing a wiring that supplies a signal representing a clock signal or a fixed potential. Therefore, in the display device according to one embodiment of the present invention, the configuration of the circuit including the wiring can be simplified while partial driving can be performed.

BRIEF DESCRIPTION OF DRAWINGS

The patent or application file contains at least one drawing executed in color. Copies of this patent or patent application publication with the color drawing will be provided by the Office upon request and payment of the necessary fee.

In the accompanying drawings.

BEST MODE FOR CARRYING OUT THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention is not construed as being limited to the description of the embodiments below.

(Example of Display Device)

A display device according to one embodiment of the present invention will be hereinafter described with reference to FIGS. 1A and 1B, FIGS. 2A to 2C, FIGS. 3A to 3C, FIG. 4, FIG. 5, FIG. 6, FIG. 7, FIG. 8, FIG. 9, FIG. 10, FIG. 11, FIGS. 12A and 12B, FIGS. 13A and 13B, FIGS. 14A and 14B, FIGS. 15A to 15C, and FIGS. 16A to 16F.

Figure 1A:
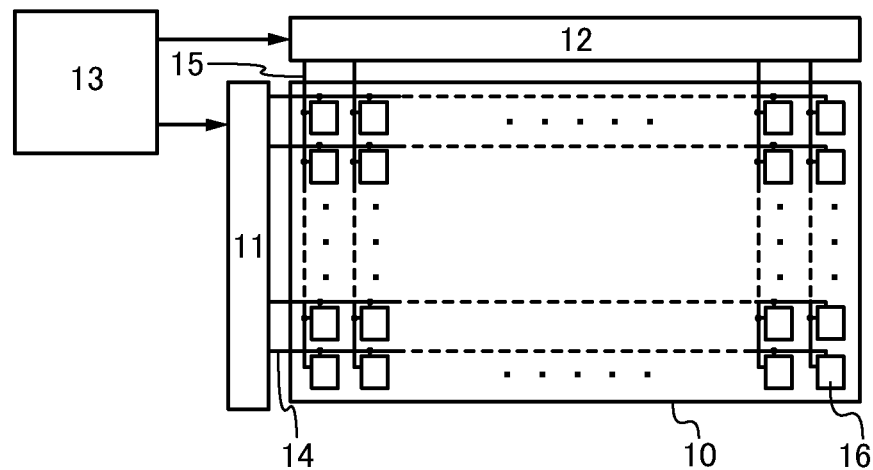
FIG. 1A illustrates an example of a display device.

FIG. 1A illustrates an example of a structure of a display device. The display device in FIG. 1A includes a pixel portion 10, a scan line driver circuit 11, a signal line driver circuit 12, a controller 13, m scan lines 14 (m is a natural number of 2 or more), and n signal lines 15 (n is a natural number of 2 or more). The scan lines 14 are placed parallel or approximately parallel to each other. The potentials of the scan lines 14 are controlled by the scan line driver circuit 11. The signal lines 15 are placed parallel or approximately parallel to each other. The potentials of the signal lines 15 are controlled by the signal line driver circuit 12. The pixel portion 10 includes a plurality of pixels 16 arranged in a matrix (of m rows and n columns). Each of the scan lines 14 is electrically connected to the pixels 16 arranged in a given row, among the plurality of pixels 16 arranged in matrix. Each of the signal lines 15 is electrically connected to the pixels 16 arranged in a given column, among the plurality of pixels 16. Signals such as a start signal (GSP) for the scan line driver circuit, a clock signal (GCK) for the scan line driver circuit, and a partial clock signal (PGCK) for the scan line driver circuit and drive power supplies such as a high power supply potential (Vdd) and a low power supply potential (Vss) are input to the scan line driver circuit 11 from the controller 13. Signals such as a start signal (SP) for the signal line driver circuit, a clock signal (SCK) for the signal line driver circuit, and a data signal (DATA) and drive power supplies such as the high power supply potential (Vdd) and the low power supply potential (Vss) are input to the signal line driver circuit 12 from the controller 13.

Figure 1B:
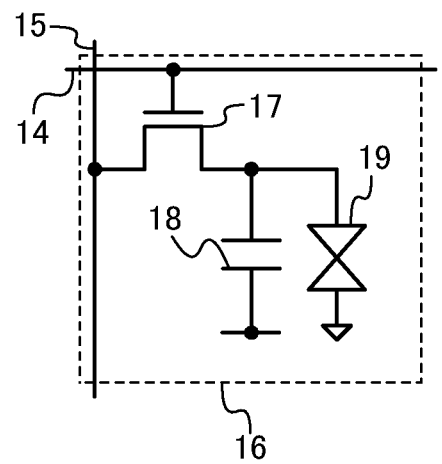
FIG. 1B is a circuit diagram illustrating an example of a pixel.

FIG. 1B illustrates an example of a circuit diagram of the pixel 16 included in the display device in FIG. 1A. The pixel 16 in FIG. 1B includes a transistor 17, a capacitor 18, and a liquid crystal element 19. A gate of the transistor 17 is electrically connected to the scan line 14. One of a source and a drain of the transistor 17 is electrically connected to the signal line 15. One of electrodes of the capacitor 18 is electrically connected to the other of the source and the drain of the transistor 17. The other of the electrodes of the capacitor 18 is electrically connected to a wiring that supplies a capacitor potential (also referred to as a capacitor line). One of electrodes (also referred to as a pixel electrode) of the liquid crystal element 19 is electrically connected to the other of the source and the drain of the transistor 17 and one of the electrodes of the capacitor 18. The other of the electrodes (also referred to as a counter electrode) of the liquid crystal element 19 is electrically connected to a wiring that supplies a counter potential. The transistor 17 is an n-channel transistor. The capacitor potential and the counter potential can be the same potential.

(Configuration Example of Scan Line Driver Circuit 11)

Figure 2A:
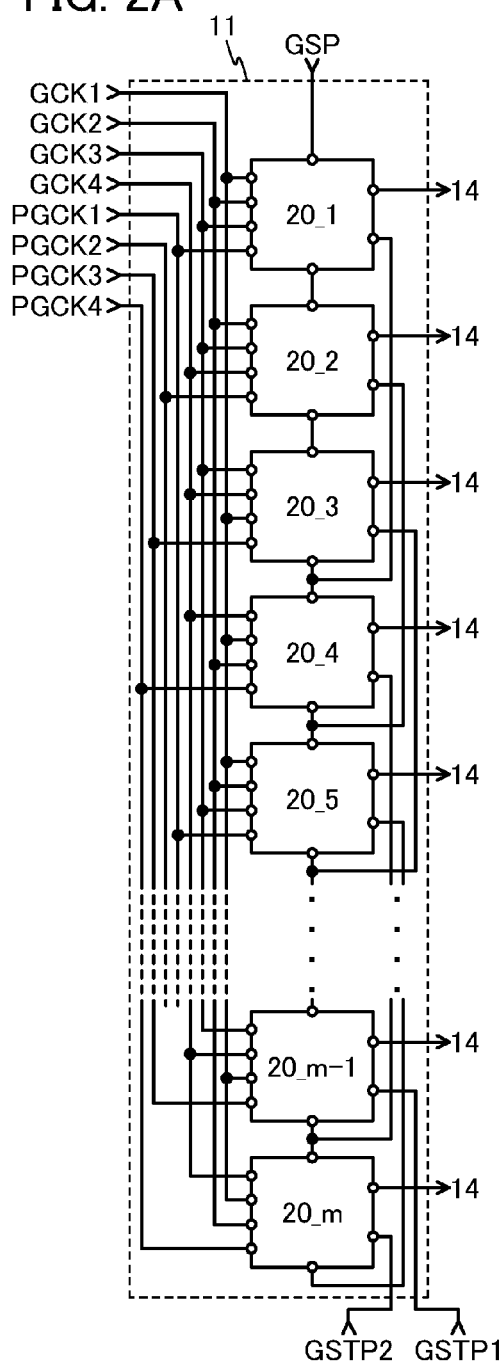
FIG. 2A illustrates an example of a configuration of a scan line driver circuit.

FIG. 2A illustrates an example of the configuration of the scan line driver circuit 11 included in the display device in FIG. 1A. The scan line driver circuit 11 in FIG. 2A includes wirings that respectively supply first to fourth clock signals (GCK1 to GCK4) for the scan line driver circuit (hereinafter "the first clock signal (GCK1)" to "the fourth clock signal GCK4"), wirings that respectively supply first to fourth partial clock signals (PGCK1 to PGCK4) for the scan line driver circuit (hereinafter "the first partial clock signal (PGCK1)" to "the fourth partial clock signal GCK4"), and first to m-th pulse output circuits 20_1 to 20_m that are connected to the respective scan lines 14 in the first to m-th rows.

Figure 2B:
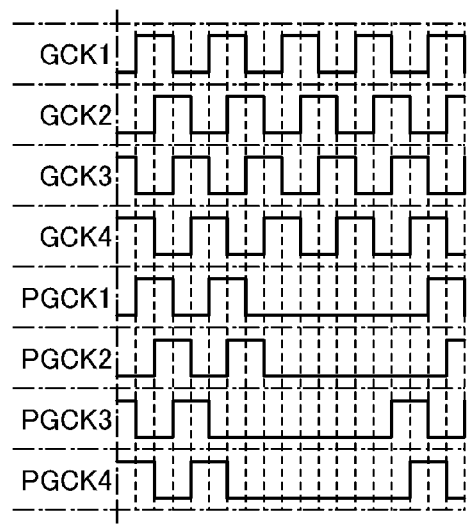
FIG. 2B is a timing chart showing an example of operation of a scan line driver circuit.

FIG. 2B illustrates examples of specific waveforms of the above-described signals. The first clock signal (GCK1) illustrated in FIG. 2B periodically repeats a high-level potential (equal to the high power supply potential (Vdd) in FIG. 2B) and a low-level potential (equal to the low power supply potential (Vss) in FIG. 2B), and has a duty ratio of ½. The second clock signal (GCK2) is shifted from the first clock signal (GCK1) by ¼ of its cycle. The third clock signal (GCK3) is shifted from the first clock signal (GCK1) by ½ of its cycle (i.e., GCK3 is an inverted signal of the first clock signal (GCK1)). The fourth clock signal (GCK4) is shifted from the first clock signal (GCK1) by ¾ of its cycle (i.e., GCK4 is an inverted signal of the second clock signal (GCK2)). The first partial clock signal (PGCK1) selectively represents the first clock signal (GCK1) and a fixed potential (equal to the low power supply potential (Vss) in FIG. 2B). Which of GCK1 and the fixed potential the first partial clock signal (PGCK1) represents is controlled by the controller 13. Similarly, the second partial clock signal (PGCK2) selectively represents the second clock signal (GCK2) and the fixed potential. The third partial clock signal (PGCK3) selectively represents the third clock signal (GCK3) and the fixed potential. The fourth partial clock signal (PGCK4) selectively represents the fourth clock signal (GCK4) and the fixed potential.

In the above-described display device, circuits with the same configuration can be used as the first to m-th pulse output circuits 20_1 to 20_m. Note that electrical connections of a plurality of terminals included in the pulse output circuit differ depending on the pulse output circuits. Specific connection relation will be described with reference to FIGS. 2A and 2C.

Each of the first to m-th pulse output circuits 20_1 to 20_m has terminals 21 to 28. The terminals 21 to 25 and the terminal 27 are input terminals. The terminals 26 and 28 are output terminals.

First, the terminal 21 is described. The terminal 21 in the first pulse output circuit 20_1 is electrically connected to a wiring that supplies a start signal (GSP) for the scan line driver circuit. The terminal 21 in each of the second to m-th pulse output circuits 20_2 to 20_m is electrically connected to the terminal 28 in the previous-stage pulse output circuit.

Next, the terminal 22 is described. The terminal 22 in the (4a+1)th pulse output circuit (a=0, 1, 2 to (m−4)/4) is electrically connected to a wiring that supplies the first clock signal (GCK1). The terminal 22 in the (4a+2)th pulse output circuit is electrically connected to a wiring that supplies the second clock signal (GCK2). The terminal 22 in the (4a+3)th pulse output circuit is electrically connected to a wiring that supplies the third clock signal (GCK3). The terminal 22 in the (4a+4)th pulse output circuit is electrically connected to a wiring that supplies the fourth clock signal (GCK4).

Then, the terminal 23 is described. The terminal 23 in the (4a+1)th pulse output circuit is electrically connected to the wiring that supplies the second clock signal (GCK2). The terminal 23 in the (4a+2)th pulse output circuit is electrically connected to the wiring that supplies the third clock signal (GCK3). The terminal 23 in the (4a+3)th pulse output circuit is electrically connected to the wiring that supplies the fourth clock signal (GCK4). The terminal 23 in the (4a+4)th pulse output circuit is electrically connected to the wiring that supplies the first clock signal (GCK1).

Next, the terminal 24 is described. The terminal 24 in the (4a+1)th pulse output circuit is electrically connected to the wiring that supplies the third clock signal (GCK3). The terminal 24 in the (4a+2)th pulse output circuit is electrically connected to the wiring that supplies the fourth clock signal (GCK4). The terminal 24 in the (4a+3)th pulse output circuit is electrically connected to the wiring that supplies the first clock signal (GCK1). The terminal 24 in the (4a+4)th pulse output circuit is electrically connected to the wiring that supplies the second clock signal (GCK2).

Then, the terminal 25 is described. The terminal 25 in the (4a+1)th pulse output circuit is electrically connected to a wiring that supplies the first partial clock signal (PGCK1). The terminal 25 in the (4a+2)th pulse output circuit is electrically connected to a wiring that supplies the second partial clock signal (PGCK2). The terminal 25 in the (4a+3)th pulse output circuit is electrically connected to a wiring that supplies the third partial clock signal (PGCK3). The terminal 25 in the (4a+4)th pulse output circuit is electrically connected to a wiring that supplies the fourth partial clock signal (PGCK4).

Next, the terminal 26 is described. The terminal 26 in the x-th pulse output circuit (x is a natural number of 1 to m) is electrically connected to the scan line 14 in the x-th row.

Next, the terminal 27 is described. The terminal 27 in the b-th pulse output circuit (b is a natural number of 1 to m−2) is electrically connected to the terminal 28 in the (b+2)th pulse output circuit. The terminal 27 in the (m−1)th pulse output circuit is electrically connected to a wiring that supplies a first stop signal (GSTP1) for the scan line driver circuit. The terminal 27 in the m-th pulse output circuit is electrically connected to a wiring that supplies a second stop signal (GSTP2) for the scan line driver circuit. If a (m+1)th pulse output circuit is provided, the first stop signal (GSTP1) corresponds to a signal output from the terminal 28 in the (m+1)th pulse output circuit. Similarly, if a (m+2)th pulse output circuit is provided, the second stop signal (GSTP2) corresponds to a signal output from the terminal 28 in the (m+2)th pulse output circuit. Specifically, these signals can be supplied to the scan line driver circuit 11 when the (m+1)th pulse output circuit and the (m+2)th pulse output circuit are actually provided as dummy circuits or when the signals are output directly from the controller 13, for example.

The connection relation of the terminal 28 in each of the pulse output circuits has been described above; therefore, the aforementioned description is applied here.

(Configuration Example of Pulse Output Circuit)

Figure 2C:
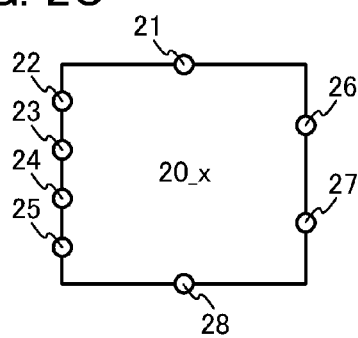
FIG. 2C illustrates an example of a configuration of a pulse output circuit.
Figure 3A:
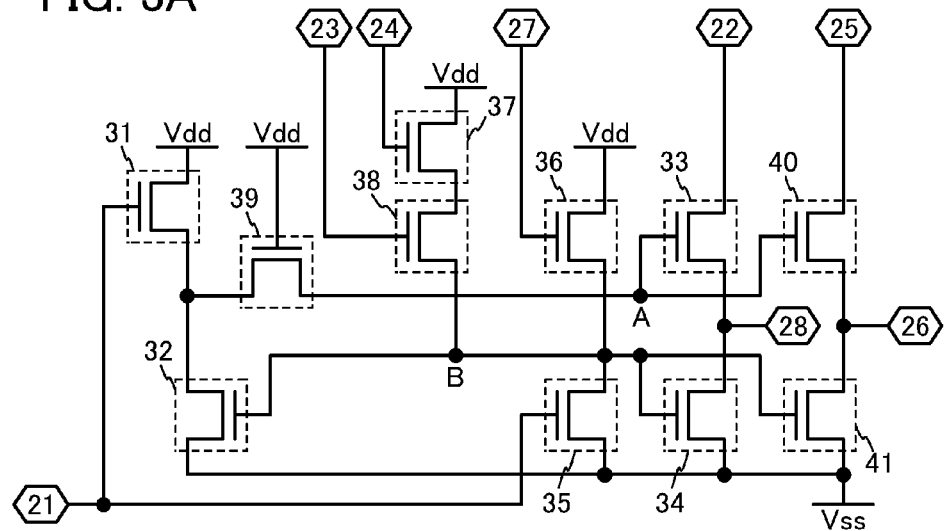
FIG. 3A is a circuit diagram illustrating an example of a pulse output circuit.

FIG. 3A illustrates an example of the configuration of the pulse output circuit illustrated in FIGS. 2A and 2C. The pulse output circuit illustrated in FIG. 3A includes transistors 31 to 41.

One of a source and a drain of the transistor 31 is electrically connected to a wiring that supplies the high power supply potential (Vdd) (hereinafter also referred to as a high power supply potential line). A gate of the transistor 31 is electrically connected to the terminal 21.

One of a source and a drain of the transistor 32 is electrically connected to a wiring that supplies the low power supply potential (Vss) (hereinafter also referred to as a low power supply potential line). The other of the source and the drain of the transistor 32 is electrically connected to the other of the source and the drain of the transistor 31.

One of a source and a drain of the transistor 33 is electrically connected to the terminal 22. The other of the source and the drain of the transistor 33 is electrically connected to the terminal 28.

One of a source and a drain of the transistor 34 is electrically connected to the low power supply potential line. The other of the source and the drain of the transistor 34 is electrically connected to the terminal 28. A gate of the transistor 34 is electrically connected to a gate of the transistor 32.

One of a source and a drain of the transistor 35 is electrically connected to the low power supply potential line. The other of the source and the drain of the transistor 35 is electrically connected to the gate of the transistor 32 and the gate of the transistor 34. A gate of the transistor 35 is electrically connected to the terminal 21.

One of a source and a drain of the transistor 36 is electrically connected to the high power supply potential line. The other of the source and the drain of the transistor 36 is electrically connected to the gate of the transistor 32, the gate of the transistor 34, and the other of the source and the drain of the transistor 35. A gate of the transistor 36 is electrically connected to the terminal 27. Note that it is possible to employ a structure in which one of the source and the drain of the transistor 36 is electrically connected to a wiring that supplies a power supply potential (Vcc) which is higher than the low power supply potential (Vss) and lower than the high power supply potential (Vdd).

One of a source and a drain of the transistor 37 is electrically connected to the high power supply potential line. A gate of the transistor 37 is electrically connected to the terminal 24. Note that it is possible to employ a structure in which one of the source and the drain of the transistor 37 is electrically connected to a wiring that supplies the power supply potential (Vcc).

One of a source and a drain of the transistor 38 is electrically connected to the gate of the transistor 32, the gate of the transistor 34, the other of the source and the drain of the transistor 35, and the other of the source and the drain of the transistor 36. The other of the source and the drain of the transistor 38 is electrically connected to the other of the source and the drain of the transistor 37. A gate of the transistor 38 is electrically connected to the terminal 23.

One of a source and a drain of the transistor 39 is electrically connected to the other of the source and the drain of the transistor 31 and the other of the source and the drain of the transistor 32. The other of the source and the drain of the transistor 39 is electrically connected to a gate of the transistor 33. A gate of the transistor 39 is electrically connected to the high power supply potential line.

One of a source and a drain of the transistor 40 is electrically connected to the terminal 25. The other of the source and the drain of the transistor 40 is electrically connected to the terminal 26. A gate of the transistor 40 is electrically connected to the gate of the transistor 33 and the other of the source and the drain of the transistor 39.

One of a source and a drain of the transistor 41 is electrically connected to the low power supply potential line. The other of the source and the drain of the transistor 41 is electrically connected to the terminal 26. A gate of the transistor 41 is electrically connected to the gate of the transistor 32, the gate of the transistor 34, the other of the source and the drain of the transistor 35, the other of the source and the drain of the transistor 36, and one of the source and the drain of the transistor 38.

Note that in the following description, a node where the gate of the transistor 33, the other of the source and the drain of the transistor 39, and the gate of the transistor 40 are electrically connected to each other is referred to as a node A. Note also that a node where the gate of the transistor 32, the gate of the transistor 34, the other of the source and the drain of the transistor 35, the other of the source and the drain of the transistor 36, one of the source and the drain of the transistor 38, and the gate of the transistor 41 are electrically connected to each other is referred to as a node B.

(Operation Example of Pulse Output Circuit)

Figure 3B:
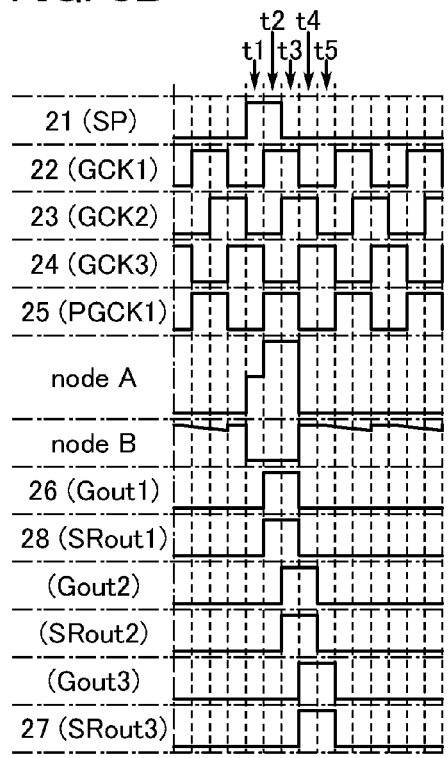
FIGS. 3B and 3C are timing charts each showing an example of operation of a pulse output circuit.
Figure 3C:
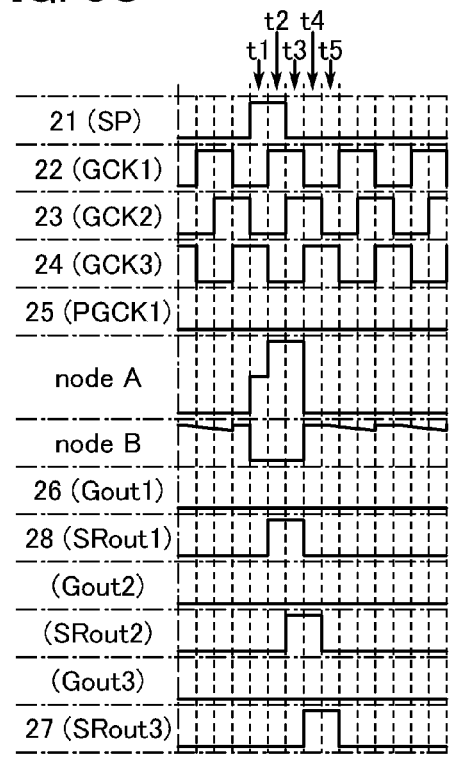

An example of operation of the above-described pulse output circuit will be described with reference to FIGS. 3B and 3C. FIG. 3B shows the potentials of signals input to each terminal of the pulse output circuit and the potentials of the node A and the node B in the case where one of the first to fourth partial clock signals (PGCK1 to PGCK4), which is input to the terminal 25 of the pulse output circuit, is one of the first to fourth clock signals (GCK1 to GCK4). FIG. 3C shows the potentials of signals input to each terminal of the pulse output circuit and the potentials of the node A and the node B in the case where one of the first to fourth partial clock signals (PGCK1 to PGCK4), which is input to the terminal 25 of the pulse output circuit, is a fixed potential (the low power supply potential Vss). Moreover, in FIGS. 3B and 3C, the signal input to each terminal of the first pulse output circuit 20_1 in the respective conditions of FIGS. 3B and 3C is shown in parentheses. In FIGS. 3B and 3C, an output signal (Gout1) of the terminal 26 and an output signal (SRout1) of the terminal 28 in the first pulse output circuit 20_1 are also shown. FIGS. 3B and 3C also show an output signal (Gout2) of the terminal 26 and an output signal (SRout2) of the terminal 28 in the second pulse output circuit 202, and an output signal (Gout3) of the terminal 26 and an output signal (SRout3) of the terminal 28 in the third pulse output circuit 20_3 (SRout3 corresponds to an input signal of the terminal 27 in the first pulse output circuit 20_1). Note that in FIGS. 3B and 3C, Gout represents an output signal from the pulse output circuit to a scan line, and SRout represents an output signal from the pulse output circuit to the subsequent-stage pulse output circuit.

First, the case where one of the first to fourth partial clock signals (PGCK1 to PGCK4), which is input to the terminal 25 of the pulse output circuit, is one of the first to fourth clock signals (GCK1 to GCK4) will be described with reference to FIG. 3B.

In a period t1, the high power supply potential (Vdd) is input to the terminal 21 of the pulse output circuit. Thus, the transistors 31 and 35 are turned on. As a result, the potential of the node A is increased to a high-level potential (a potential that is decreased from the high power supply potential (Vdd) by the threshold voltage of the transistor 31 or the transistor 39), and the potential of the node B is decreased to the low power supply potential (Vss). The transistors 33 and 40 are turned on and the transistors 32, 34, and 41 are turned off accordingly. Thus, in the period t1, a signal output from the terminal 28 of the pulse output circuit is a signal input to the terminal 22, and a signal output from the terminal 26 is a signal input to the terminal 25. Here, in the period t1, both the signal input to the terminal 22 and the signal input to the terminal 25 of the pulse output circuit are the low power supply potential (Vss). Therefore, in the period t1, the pulse output circuit outputs the low power supply potential (Vss) to the terminal 21 of the subsequent-stage pulse output circuit and a scan line electrically connected to the terminal 26. Note that although not directly concerned with output signals of the pulse output circuit in the period t1, the transistor 38 is turned off because the low power supply potential (Vss) is input to the terminal 23; the transistor 37 is turned on because the high power supply potential (Vdd) is input to the terminal 24; and the transistor 36 is turned off because the low power supply potential (Vss) is input to the terminal 27.

In a period t2, the high power supply potential (Vdd) is input to the terminals 22 and 25 of the pulse output circuit. Note that the potential of the node A (the potential of the source of the transistor 39) is increased to the high-level potential in the period t1, so that the transistor 39 is off. At this time, by inputting the high power supply potential (Vdd) to the terminals 22 and 25, the potential of the node A (the potential of the gate of the transistor 33 and the gate of the transistor 40) is further increased by capacitive coupling of the source and the gate of the transistor 33 and the source and the gate of the transistor 40 (bootstrap operation). Moreover, with the bootstrap operation, the potentials output from the terminals 26 and 28 can be set to the high power supply potential (Vdd) without being decreased. Thus, in the period t2, the pulse output circuit outputs the high power supply potential (Vdd) to the terminal 21 of the subsequent-stage pulse output circuit and the scan line electrically connected to the terminal 26. Note that although not directly concerned with output signals of the pulse output circuit in the period t2, the transistor 37 is turned off because the low power supply potential (Vss) is input to the terminal 24.

In a period t3, the low power supply potential (Vss) is input to the terminal 21 of the pulse output circuit. Thus, the transistors 31 and 35 are turned off. At this time, the node A remains in a floating state, so that the transistors 33 and 40 remain on. Thus, in the period t3, a signal output from the terminal 28 of the pulse output circuit is a signal input to the terminal 22, and a signal output from the terminal 26 is a signal input to the terminal 25. Here, in the period t3, the high power supply potential (Vdd) is input to both the terminal 22 and the terminal 25 of the pulse output circuit. Thus, in the period t3, the pulse output circuit outputs the high power supply potential (Vdd) to the terminal 21 of the subsequent-stage pulse output circuit and the scan line electrically connected to the terminal 26. Note that although not directly concerned with output signals of the pulse output circuit in the period t3, the transistor 38 is turned on because the high power supply potential (Vdd) is input to the terminal 23.

In a period t4, the high power supply potential (Vdd) is input to the terminals 24 and 27 of the pulse output circuit. Thus, the transistors 36 and 37 are turned on. As a result, the potential of the node B is increased to a high-level potential (a potential that is decreased from the high power supply potential (Vdd) by the threshold voltage of the transistor 36, the transistor 37, or the transistor 38). The transistors 32, 34, and 41 are turned on accordingly. Moreover, when the transistor 32 is turned on, the potential of the source (one of the source and the drain) of the transistor 39 becomes the low power supply potential (Vss). Thus, the transistor 39 is turned on, so that the potential of the node A is decreased to the low power supply potential (Vss). The transistors 33 and 40 are turned off accordingly. Thus, in the period t4, a signal output from the terminal 28 and a signal output from the terminal 26 of the pulse output circuit are the low power supply potential (Vss). That is, in the period t4, the pulse output circuit outputs the low power supply potential (Vss) to the terminal 21 of the subsequent-stage pulse output circuit and the scan line electrically connected to the terminal 26.

In a period t5 or later, the node A remains at the low power supply potential (Vss) and the node B remains at the high-level potential until the high power supply potential (Vdd) is input to the terminal 21 of the pulse output circuit. Thus, in those periods, the pulse output circuit outputs the low power supply potential (Vss) to the terminal 21 of the subsequent-stage pulse output circuit and the scan line electrically connected to the terminal 26.

Next, the case where one of the first to fourth partial clock signals (PGCK1 to PGCK4), which is input to the terminal 25 of the pulse output circuit, is the fixed potential (the low power supply potential Vss) will be described with reference to FIG. 3C.

In the period t1, the high power supply potential (Vdd) is input to the terminal 21 of the pulse output circuit. As described above, in the period t1, a signal output from the terminal 28 of the pulse output circuit is a signal input to the terminal 22, and a signal output from the terminal 26 is a signal input to the terminal 25. Here, in the period t1, both the signal input to the terminal 22 and the signal input to the terminal 25 of the pulse output circuit are the low power supply potential (Vss). Thus, in the period t1, the pulse output circuit outputs the low power supply potential (Vss) to the terminal 21 of the subsequent-stage pulse output circuit and the scan line electrically connected to the terminal 26.

In the period t2, the high power supply potential (Vdd) is input to the terminal 22 of the pulse output circuit. As described above, with the bootstrap operation, the potential output from the terminal 28 can be set to the high power supply potential (Vdd) without being decreased. Note that the signal input to the terminal 25 remains unchanged from the low power supply potential (Vss), which is different from the above description. Therefore, the signal output from the terminal 26 of the pulse output circuit remains unchanged from the low power supply potential (Vss).

In the period t3, the low power supply potential (Vss) is input to the terminal 21 of the pulse output circuit. As described above, in the period t3, a signal output from the terminal 28 of the pulse output circuit is a signal input to the terminal 22, and a signal output from the terminal 26 is a signal input to the terminal 25. Here, in the period t3, the high power supply potential (Vdd) is input to the terminal 22 of the pulse output circuit and the low power supply potential (Vss) is input to the terminal 25. Thus, in the period t3, the pulse output circuit outputs the high power supply potential (Vdd) to the terminal 21 of the subsequent-stage pulse output circuit, and outputs the low power supply potential (Vss) to the scan line electrically connected to the terminal 26.

In the period t4, the high power supply potential (Vdd) is input to the terminals 24 and 27 of the pulse output circuit. As described above, in the period t4, a signal output from the terminal 28 and a signal output from the terminal 26 of the pulse output circuit are the low power supply potential (Vss). Thus, in the period t4, the pulse output circuit outputs the low power supply potential (Vss) to the terminal 21 of the subsequent-stage pulse output circuit and the scan line electrically connected to the terminal 26.

In the period t5 or later, the node A remains at the low power supply potential (Vss) and the node B remains at the high-level potential until the high power supply potential (Vdd) is input to the terminal 21 of the pulse output circuit. Thus, in those periods, the pulse output circuit outputs the low power supply potential (Vss) to the terminal 21 of the subsequent-stage pulse output circuit and the scan line electrically connected to the terminal 26.

(Pulse Output Circuit and Scan Line Driver Circuit Including the Same)

In the above-described pulse output circuit, whether or not a selection signal (the high power supply potential (Vdd)) is output to the scan line in the period t2 and the period t3 is selected in accordance with a signal input to the terminal 25. Specifically, the pulse output circuit outputs a selection signal when the signal input to the terminal 25 is the first clock signal for the scan line driver circuit, and outputs a non-selection signal when the signal input to the terminal 25 is a fixed potential (the low power supply potential (Vss)). Furthermore, the pulse output circuit also has a function of shifting a selection signal to the subsequent-stage pulse output circuit regardless of the above operation. That is, a shift register can be formed using a plurality of the pulse output circuits.

In the display device disclosed in this specification, a scan line driver circuit includes the shift register. Thus, in the display device, the supply of a selection signal can be controlled per scan line. In other words, rewriting of only a given section of an image can be performed in the display device disclosed in this specification.

In addition, the display device disclosed in this specification can realize the above-described operation by providing wirings that supply a signal representing the respective first to fourth clock signals (GCK1 to GCK4) or a fixed potential (the low power supply potential (Vss)). Therefore, in the display device disclosed in this specification, the configuration of the circuit including the wirings can be simplified while partial driving can be performed.

Which of the clock signal and a fixed potential is supplied to the wiring is controlled by the controller 13. An example of a specific structure of the controller 13 and a method for selecting a signal output to the wiring will be described below.

(Structure Example of Controller 13)

Figure 4:
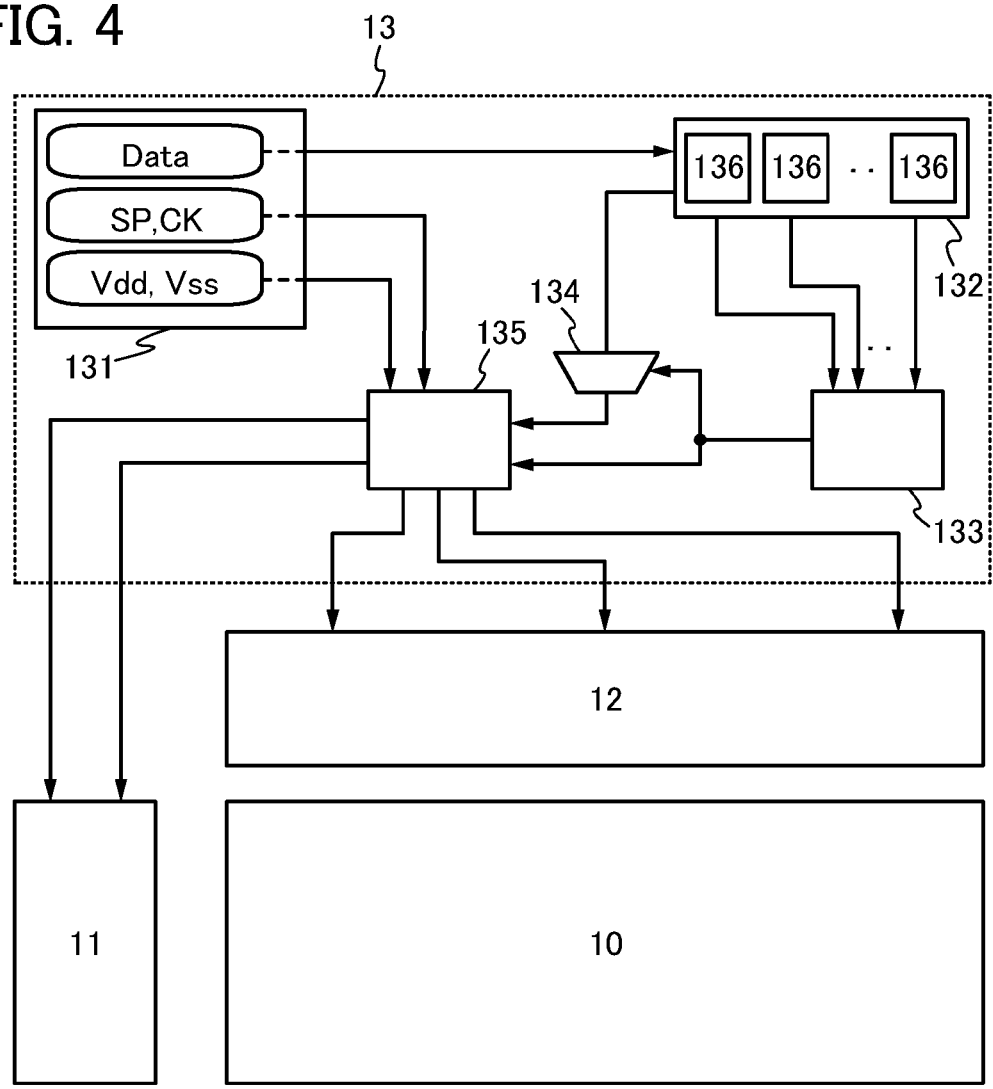
FIG. 4 illustrates an example of a configuration of a controller.

FIG. 4 illustrates an example of the structure of the controller 13 having three modes of a normal mode, a partial driving mode, and a standby mode. Note that in the normal mode, the first to fourth partial clock signals (PGCK1 to PGCK4) are the same as the first to fourth clock signals (GCK1 to GCK4) regardless of periods. In the partial driving mode, the first to fourth partial clock signals (PGCK1 to PGCK4) are the same as the first to fourth clock signals (GCK1 to GCK4) or a fixed potential. In the standby mode, a clock signal or the like is not supplied to the scan line driver circuit 11 and the signal line driver circuit 12. The controller 13 in FIG. 4 includes a signal generator circuit 131, a storage circuit 132, a comparator circuit 133, a selector circuit 134, and a display control circuit 135.

The signal generator circuit 131 generates signals for operating the scan line driver circuit 11 and the signal line driver circuit 12 and a signal for producing an image in the pixel portion 10. Specifically, the signal generator circuit 131 generates and outputs an image signal (Data) input to the plurality of pixels arranged in matrix in the pixel portion 10, a signal for controlling operation of the scan line driver circuit 11 or the signal line driver circuit 12 (e.g., a start signal (SP) and a clock signal (CK)), the high power supply potential (Vdd) and the low power supply potential (Vss) which are power supply voltages, and the like. Note that in the controller 13 illustrated in FIG. 4, the signal generator circuit 131 outputs the image signal (Data) to the storage circuit 132, and outputs the signal for controlling operation of the scan line driver circuit 11 or the signal line driver circuit 12 to the display control circuit 135. In the case where the image signal (Data) output from the signal generator circuit 131 to the storage circuit 132 is an analog signal, the image signal (Data) can be converted into a digital signal through an A/D converter or the like.

The storage circuit 132 includes a plurality of memories 136 that store image signals for producing first to n-th images (n is a natural number) in the pixel portion 10. The memory 136 is formed using a storage element such as a dynamic random access memory (DRAM) or a static random access memory (SRAM). Each of the memories 136 stores image signals for one image to be produced in the pixel portion 10, and there is no particular limitation on the number of the memories 136. Further, image signals stored in the plurality of memories 136 are selectively read by the comparator circuit 133 and the selector circuit 134.

The comparator circuit 133 selectively reads an image signal for producing a k-th image (k is a natural number greater than or equal to 1 and less than n) and an image signal for producing a (k+1)th image which are stored in the storage circuit 132, compares these image signals, and detects a difference between the image signals. Note that the k-th image and the (k+1)th image are images that are successively displayed on the pixel portion 10. The difference is detected by comparison between image signals by the comparator circuit 133. Which of the normal mode, the partial driving mode, and the standby mode the controller 13 is put in is determined in accordance with the difference.

The selector circuit 134 selects output of an image signal to the pixel portion 10 on the basis of the difference detected by the comparator circuit 133. Specifically, the selector circuit 134 outputs image signals for one frame in the case where the comparator circuit 133 determines that the controller 13 is to be put in the normal mode. The selector circuit 134 selectively outputs image signals in the case where the comparator circuit 133 determines that the controller 13 is to be put in the partial driving mode. The selector circuit 134 does not output an image signal in the case where the comparator circuit 133 determines that the controller 13 is to be put in the standby mode.

The display control circuit 135 controls supply of control signals such as the start signal (SP), the clock signal (CK), the high power supply potential (Vdd), and the low power supply potential (Vss) to the scan line driver circuit 11 and the signal line driver circuit 12.

Specifically, in the case where the comparator circuit 133 determines that the controller 13 is to be put in the normal mode, the display control circuit 135 outputs to the signal line driver circuit 12 the image signals (Data) supplied from the selector circuit 134, and supplies control signals (e.g., the start signal (SP), the clock signal (CK), the high power supply potential (Vdd), and the low power supply potential (Vss)) to the scan line driver circuit 11 and the signal line driver circuit 12. Note that in that case, the first to fourth partial clock signals (PGCK1 to PGCK4) that are supplied to the scan line driver circuit 11 are the same as the first to fourth clock signals (GCK1 to GCK4).

In the case where the comparator circuit 133 determines that the controller 13 is to be put in the partial driving mode, the display control circuit 135 selectively outputs to the signal line driver circuit 12 the image signals (Data) supplied from the selector circuit 134, and supplies control signals (e.g., the start signal (SP), the clock signal (CK), the high power supply potential (Vdd), and the low power supply potential (Vss)) to the scan line driver circuit 11 and the signal line driver circuit 12. Note that in that case, the first to fourth partial clock signals (PGCK1 to PGCK4) that are supplied to the scan line driver circuit 11 are a signal that selectively represents a signal same as the first to fourth clock signals (GCK1 to GCK4) and a fixed potential, in accordance with the image signals (Data) which are selectively output.

In the case where the comparator circuit 133 determines that the controller 13 is to be put in the standby mode, an image signal (Data) is not supplied from the selector circuit 134, and the display control circuit 135 does not supply control signals (e.g., the start signal (SP), the clock signal (CK), the high power supply potential (Vdd), and the low power supply potential (Vss)) to the scan line driver circuit 11 and the signal line driver circuit 12. That is, in the case where the comparator circuit 133 determines that the controller 13 is to be put in the standby mode, the operation of the scan line driver circuit 11 and the signal line driver circuit 12 is completely stopped.

Note that in the case where a period during which the controller 13 is in the standby mode is short, it is possible to continue supply of the high power supply potential (Vdd) and the low power supply potential (Vss). Note that the expression "supply of the high power supply potential (Vdd) and the low power supply potential (Vss)" means that the potential of a given wiring is fixed at the high power supply potential (Vdd) or the low power supply potential (Vss). That is, a given potential of the wiring is changed to the high power supply potential (Vdd) or the low power supply potential (Vss). The change in potential is accompanied by consumption of power; therefore, when the supply of the high power supply potential (Vdd) and the low power supply potential (Vss) is stopped and restarted at frequent intervals, power consumption might be increased as a result. In such a case, it is preferable to employ a structure in which the high power supply potential (Vdd) and the low power supply potential (Vss) continue to be supplied. Note that in the foregoing description, "not supply a signal" means that a potential different from a predetermined potential is supplied to a wiring that supplies the signal, or that a node electrically connected to the wiring is brought into a floating state.

In the case where a period in which the controller 13 is in the standby mode is extended or the case where scan lines in a given region are in a non-selection state for a long time in the partial driving mode, direct-current voltage continues to be applied to the liquid crystal element 19 for a long time. This might cause burn-in. Therefore, the polarity of a voltage applied to the liquid crystal element is preferably inverted per predetermined frame or per predetermined period, regardless of modes.

By controlling the operation of the scan line driver circuit 11 and the signal line driver circuit 12 as described above by the controller 13, power consumption of the display device can be reduced.

(Example of Transistor 17 Provided in Pixel 16)

It is possible that the transistor 17 provided in the pixel 16 in the display device is kept off for a long time. For that reason, a transistor with excellent off-state characteristics (with a small off-state current) is preferably used as the transistor 17. An example of a transistor that is preferably used as the transistor 17 will be described below with reference to FIG. 5. Specifically, a transistor including an oxide semiconductor layer will be described. The off-state current of the transistor can be extremely reduced when the oxide semiconductor layer is purified (which is described below in detail). Thus, the transistor is preferably employed as the transistor 17 provided in the pixel 16 in the display device disclosed in this specification; in the display device, it might be possible that an image signal is not input to a given pixel for a long time. The transistor can also be used for forming the above-described pulse output circuit. That is, the transistor can be used as the transistors 31 to 41. In that case, reduction in cost and increase in yield due to reduction in the number of manufacturing steps can be achieved.

Figure 5:
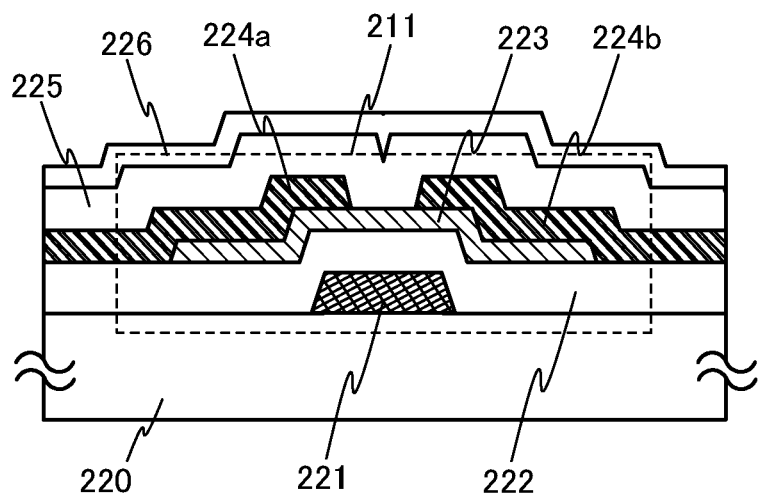
FIG. 5 is a cross-sectional view illustrating an example of a transistor.

A transistor 211 illustrated in FIG. 5 includes a gate layer 221 provided over a substrate 220 having an insulating surface, a gate insulating layer 222 provided over the gate layer 221, an oxide semiconductor layer 223 provided over the gate insulating layer 222, and a source layer 224a and a drain layer 224b provided over the oxide semiconductor layer 223. Moreover, FIG. 5 illustrates an insulating layer 225 that covers the transistor 211 and is in contact with the oxide semiconductor layer 223, and a protective insulating layer 226 provided over the insulating layer 225.

As described above, the transistor 211 in FIG. 5 includes the oxide semiconductor layer 223 as a semiconductor layer. Examples of an oxide semiconductor used for the oxide semiconductor layer 223 are an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor which are oxides of two metal elements; and an In—O-based oxide semiconductor, a Sn—O-based oxide semiconductor, and a Zn—O-based oxide semiconductor which are oxides of one metal element. Further, $SiO_2$ may be contained in the above oxide semiconductor. Here, for example, an In—Ga—Zn—O-based oxide semiconductor is an oxide containing at least In, Ga, and Zn, and there is no particular limitation on the composition ratio of the elements. An In—Ga—Zn—O-based oxide semiconductor may contain an element other than In, Ga, and Zn.

As the oxide semiconductor layer 223, a thin film expressed by a chemical formula of $InMO_3(ZnO)_m$ (m>0) can be used. Here, M represents one or more metal elements selected from Ga, Al, Mn, and Co. For example, M can be Ga, Ga and Al, Ga and Mn, or Ga and Co.

In the case where an In—Zn—O-based material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, when a target used for forming an In—Zn—O-based oxide semiconductor has an atomic ratio of In:Zn:O=X:Y:Z, the relation of Z>(1.5X+Y) is satisfied.

The above-described oxide semiconductor is an oxide semiconductor that is purified and made to be electrically i-type (intrinsic) as follows: an impurity such as hydrogen, moisture, a hydroxyl group, or hydride (also referred to as a hydrogen compound), which is a factor of variation in electric characteristics, is intentionally eliminated in order to prevent variation in electric characteristics.

Therefore, it is preferable that the oxide semiconductor contain as little hydrogen as possible. Moreover, the number of carriers derived from hydrogen, oxygen vacancy, and the like is extremely small (close to zero) in the purified oxide semiconductor layer, and the carrier density is less than $1\times10^{12}/cm^3$, preferably less than $1\times10^{11}/cm^3$. In other words, the density of carriers derived from hydrogen, oxygen vacancy, and the like in the oxide semiconductor layer is made as close to zero as possible. Since the oxide semiconductor layer has very few carriers derived from hydrogen, oxygen vacancy, and the like, the amount of leakage current at the time when the transistor is off (i.e., off-state current) can be small. Furthermore, since the number of impurity states derived from hydrogen, oxygen vacancy, and the like is small, variation and deterioration of electric characteristics due to light irradiation, temperature change, application of bias, or the like can be reduced. Note that the smaller the amount of off-state current is, the better. The transistor including the oxide semiconductor for a semiconductor layer has an off-state current value (per channel width (W) of 1 μm) of 100 zA (zeptoamperes) or less, preferably 10 zA or less, more preferably 1 zA or less. Further, the transistor does not have pn junction and hot carrier degradation does not occur, so that electrical characteristics of the transistor are not adversely affected thereby.

The off-state current can be extremely small in a transistor in which an oxide semiconductor layer that is purified by drastically removing hydrogen contained therein as described above is used for a channel formation region. In other words, in circuit design, the oxide semiconductor layer can be considered as an insulator when the transistor is off. On the other hand, when the transistor is on, the current supply capability of the oxide semiconductor layer is expected to be higher than that of a semiconductor layer formed of amorphous silicon.

As the substrate 220 having an insulating surface, a glass substrate of barium borosilicate glass, aluminoborosilicate glass, or the like can be used, for example.

In the transistor 211, an insulating film serving as a base film may be provided between the substrate 220 and the gate layer 221. The base film has a function of preventing diffusion of an impurity element from the substrate, and can be formed with a single-layer structure or a layered structure using one or more of a silicon nitride film, a silicon oxide film, a silicon nitride oxide film, and a silicon oxynitride film.

The gate layer 221 can be formed with a single-layer structure or a layered structure using a metal material such as molybdenum, titanium, chromium, tantalum, tungsten, aluminum, copper, neodymium, or scandium or an alloy material containing any of these materials as its main component.

The gate insulating layer 222 can be formed with a single-layer structure or a layered structure including a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by a plasma CVD method, a sputtering method, or the like. For example, a silicon nitride layer (SiNy (y>0)) with a thickness of 50 nm to 200 nm can be formed as a first gate insulating layer by a plasma CVD method, and a silicon oxide layer (SiOx (x>0)) with a thickness of 5 nm to 300 nm as a second gate insulating layer can be stacked over the first gate insulating layer.

A conductive film used for the source layer 224a and the drain layer 224b can be formed using an element selected from Al, Cr, Cu, Ta, Ti, Mo, and W, an alloy including any of these elements as a component, or an alloy film including a combination of any of these elements, for example. A structure may be employed in which a high-melting-point metal layer of Ti, Mo, W, or the like is stacked on one or both of a top surface and a bottom surface of a metal layer of Al, Cu, or the like. By using an aluminum material to which an element preventing generation of hillocks and whiskers in an aluminum film (e.g., Si, Nd, or Sc) is added, heat resistance can be increased.

The conductive film to be the source layer 224a and the drain layer 224b (including a wiring layer formed using the same layer as the source and drain layers) may be formed using a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, referred to as ITO), an alloy of indium oxide and zinc oxide ($In_2O_3$—ZnO), or any of the metal oxide materials containing silicon or silicon oxide can be used.

As the insulating layer 225, an inorganic insulating film typified by a silicon oxide film, a silicon oxynitride film, an aluminum oxide film, or an aluminum oxynitride film can be used.

As the protective insulating layer 226, an inorganic insulating film such as a silicon nitride film, an aluminum nitride film, a silicon nitride oxide film, or an aluminum nitride oxide film can be used.

A planarization insulating film may be formed over the protective insulating layer 226 in order to reduce surface roughness due to the transistor. The planarization insulating film can be formed using an organic material such as polyimide, acrylic, or benzocyclobutene. Other than such organic materials, it is possible to use a low-dielectric constant material (low-k material) or the like. Note that the planarization insulating film may be formed by stacking a plurality of insulating films formed from these materials.

<Off-State Current of Transistor>

Next, results of measuring the off-state current of a transistor including a purified oxide semiconductor layer will be described.

Figure 6:
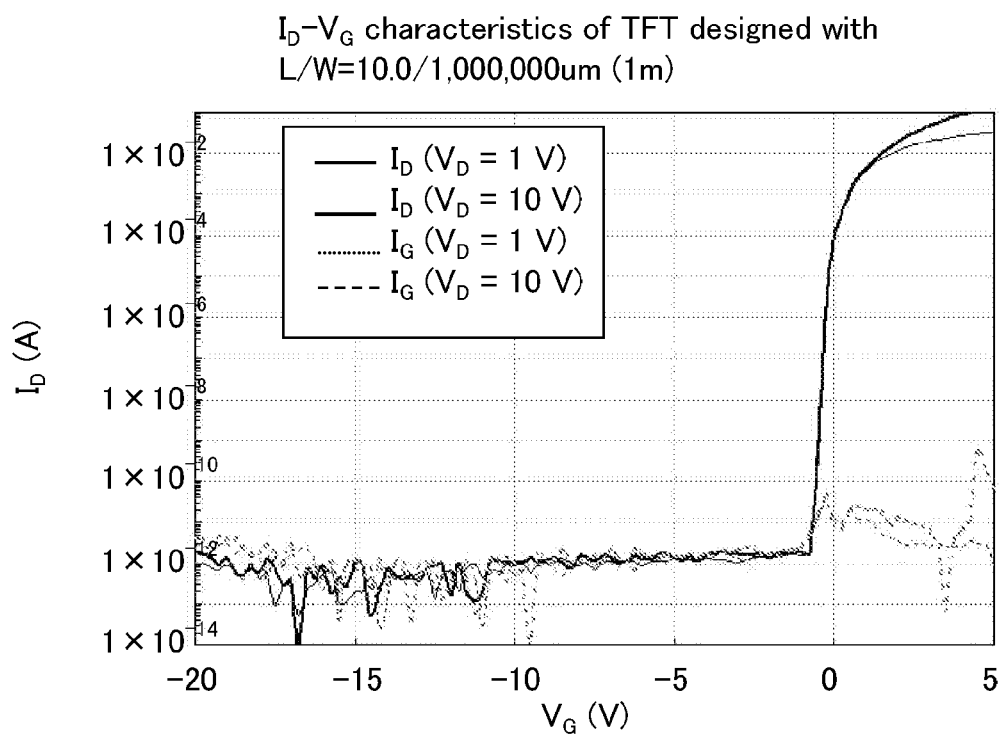
FIG. 6 shows characteristics of a transistor.

First, a transistor with a sufficiently large channel width W of 1 m was prepared in consideration of the fact that the transistor including a purified oxide semiconductor layer has an adequately small off-state current, and the off-state current was measured. FIG. 6 shows the results of measuring the off-state current of a transistor with a channel width W of 1 m. In FIG. 6, the horizontal axis represents a gate voltage VG, and the vertical axis represents a drain current ID. In the case where the drain voltage VD is +1 V or +10 V and the gate voltage VG is within the range of −20 V to −5 V, the off-state current of the transistor was found to be less than or equal to $1\times10^{-12}$ A which is the detection limit. Moreover, it was found that the off-state current (here, per channel width of 1 μm) of the transistor was 1 aA/μm ($1\times10^{-18}$ A/μm) or less.

Next, the results of more accurately measuring the off-state current of the transistor including a purified oxide semiconductor layer will be described. As described above, the off-state current of the transistor including a purified oxide semiconductor layer was found to be less than or equal to $1\times10^{-12}$ A, which is the detection limit of measurement equipment.

Here, the results of measuring more accurate off-state current (the value smaller than or equal to the detection limit of measurement equipment in the above measurement) with the use of an element for evaluating characteristics will be described.

First, an element for evaluating characteristics which was used for measuring current will be described with reference to FIG. 7.

Figure 7:
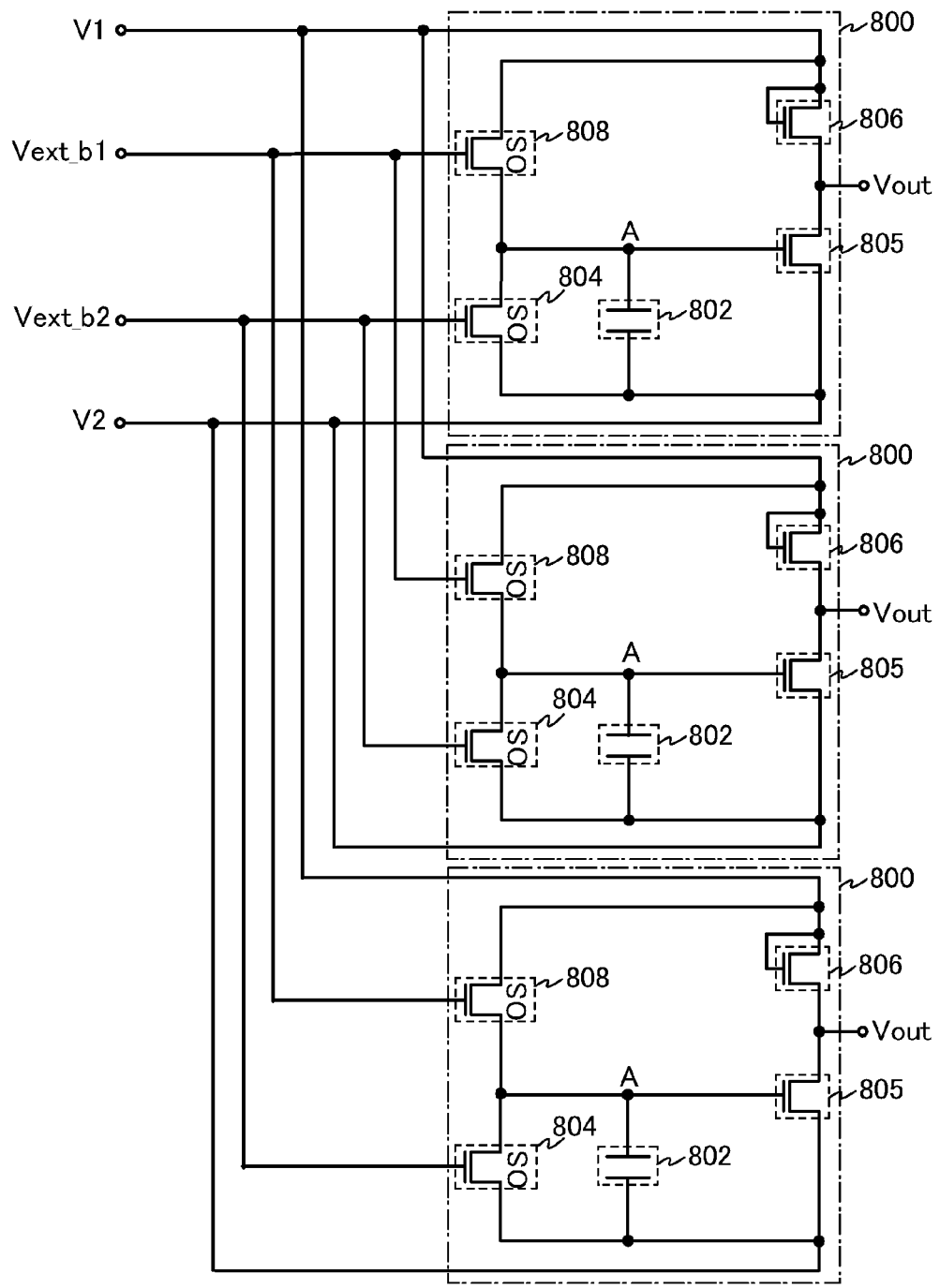
FIG. 7 is a circuit diagram of an element for evaluating characteristics of a transistor.

In the element for evaluating characteristics illustrated in FIG. 7, three measurement systems 800 are connected in parallel. The measurement system 800 includes a capacitor 802, a transistor 804, a transistor 805, a transistor 806, and a transistor 808. The transistor including a purified oxide semiconductor layer was used as the transistors 804 and 808.

In the measurement system 800, one of a source and a drain of the transistor 804, one of terminals of the capacitor 802, and one of a source and a drain of the transistor 805 are connected to a power source (for supplying V2). The other of the source and the drain of the transistor 804, one of a source and a drain of the transistor 808, the other of the terminals of the capacitor 802, and a gate of the transistor 805 are electrically connected to each other. The other of the source and the drain of the transistor 808, one of a source and a drain of the transistor 806, and a gate of the transistor 806 are electrically connected to a power source (for supplying V1). The other of the source and the drain of the transistor 805 and the other of the source and the drain of the transistor 806 are electrically connected to an output terminal.

A potential Vext_b2 for controlling the on/off state of the transistor 804 is supplied to a gate of the transistor 804. A potential Vext_b1 for controlling the on/off state of the transistor 808 is supplied to a gate of the transistor 808. A potential Vout is output from the output terminal.

Next, a method for measuring current with the use of the element for evaluating characteristics will be described.

First, an initial period in which a potential difference is applied to measure the off-state current is briefly described. In the initial period, the potential Vext_b1 for turning on the transistor 808 is input to the gate of the transistor 808, and the potential V1 is applied to a node A that is a node electrically connected to the other of the source and the drain of the transistor 804 (i.e., the node electrically connected to one of the source and the drain of the transistor 808, the other of the terminals of the capacitor 802, and the gate of the transistor 805). Here, the potential V1 is, for example, a high potential. The transistor 804 is off.

After that, the potential Vext_b1 for turning off the transistor 808 is input to the gate of the transistor 808, and the transistor 808 is turned off. After the transistor 808 is turned off, the potential V1 is set low. The transistor 804 remains off. The potential V2 is the same potential as the potential V1. Thus, the initial period is completed. When the initial period is finished, a potential difference is generated between the node A and one of the source and the drain of the transistor 804. Moreover, a potential difference is generated between the node A and the other of the source and the drain of the transistor 808. Accordingly, a small amount of electric charge flows through the transistors 804 and 808. That is, the off-state current is caused.

Next, a measurement period of the off-state current is briefly described. In the measurement period, the potential of one of the source and the drain of the transistor 804 (i.e., V2) and the potential of the other of the source and the drain of the transistor 808 (i.e., V1) are fixed at low potentials. On the other hand, the potential of the node A is not fixed (the node A is in a floating state) in the measurement period. Accordingly, electric charge flows through the transistors 804 and 808, and the amount of electric charge held at the node A is changed as time passes. The potential of the node A is changed depending on the change in the amount of electric charge held at the node A. That is, the output potential Vout of the output terminal also varies.

Figure 8:
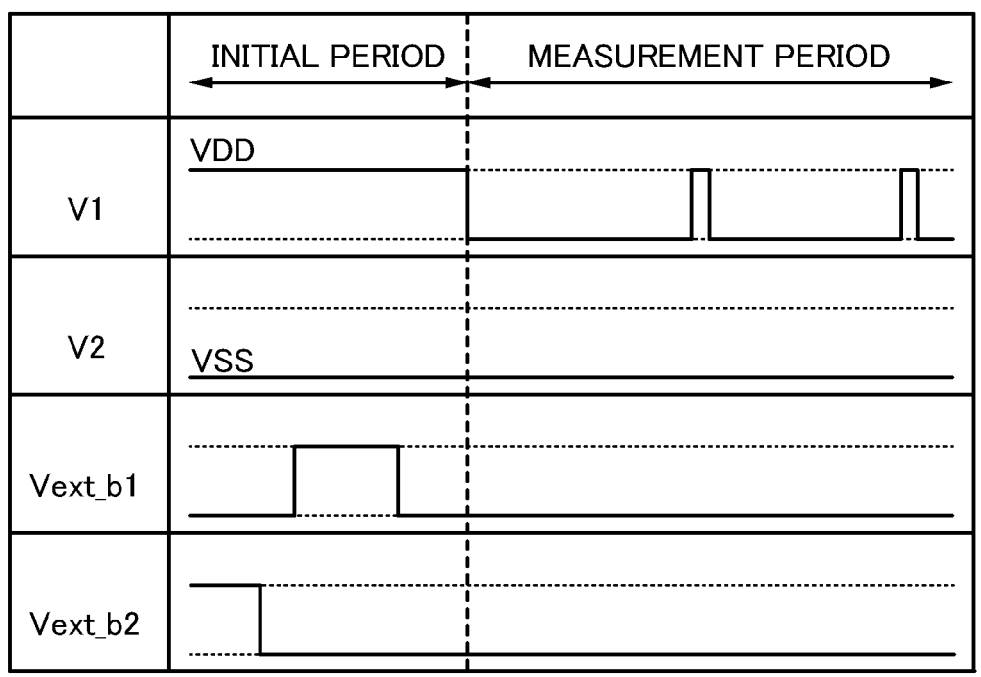
FIG. 8 is a timing chart of an element for evaluating characteristics of a transistor.

FIG. 8 shows details (a timing chart) of the relation between potentials in the initial period in which the potential difference is applied and in the following measurement period.

In the initial period, first, the potential Vext_b2 is set to a potential with which the transistor 804 is turned on (a high potential). Thus, the potential of the node A becomes V2, that is, a low potential (VSS). Note that it is not always necessary to supply the low potential (VSS) to the node A. After that, the potential Vext_b2 is set to a potential with which the transistor 804 is turned off (a low potential), so that the transistor 804 is turned off. Then, the potential Vext_b1 is set to a potential with which the transistor 808 is turned on (a high potential). Thus, the potential of the node A becomes V1, that is, a high potential (VDD). After that, the potential Vext_b1 is set to a potential with which the transistor 808 is turned off. Accordingly, the node A is brought into a floating state, and the initial period is completed.

In the following measurement period, the potential V1 and the potential V2 are set to a potential with which electric charge flows to the node A or a potential with which electric charge flows from the node A. Here, each of the potential V1 and the potential V2 is set to the low potential (VSS). Note that at the timing of measuring the output potential Vout, V1 is temporarily set to the high potential (VDD) in some cases because an output circuit needs to be operated. The period in which V1 is the high potential (VDD) is made short so as not to adversely affect the measurement.

When the potential difference is applied and the measurement period is started as described above, the amount of electric charge held at the node A is changed as time passes, and the potential of the node A is changed accordingly. This means that the potential of the gate of the transistor 805 varies; thus, the output potential Vout of the output terminal also varies over time.

A method for calculating the off-state current from the obtained output potential Vout will be described below.

The relation between the potential $V_A$ of the node A and the output potential Vout is obtained in advance before calculation of the off-state current. With this relation, the potential $V_A$ of the node A can be obtained using the output potential Vout. In accordance with the above relation, the potential $V_A$ of the node A can be expressed as a function of the output potential Vout by the following equation.

$$V_A = F(Vout) \quad \text{[Formula 1]}$$

Electric charge $Q_A$ of the node A can be expressed by the following equation with the use of the potential $V_A$ of the node A, a capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad \text{[Formula 2]}$$

Since a current $I_A$ of the node A is obtained by differentiating electric charge flowing to the node A (or electric charge flowing from the node A) with respect to time, the current $I_A$ of the node A is expressed by the following equation.

$$I_A \equiv \frac{\Delta Q_A}{\Delta t} = \frac{C_A \cdot \Delta F(Vout)}{\Delta t} \quad \text{[Formula 3]}$$

In this manner, the current $I_A$ of the node A can be obtained from the capacitance $C_A$ connected to the node A and the output potential Vout of the output terminal.

By the above method, it is possible to measure a leakage current which flows between a source and a drain of a transistor in an off state (an off-state current).

Here, the transistor 804 and the transistor 808 each of which included a purified oxide semiconductor layer and had a channel length L of 10 μm and a channel width W of 50 μm were manufactured. In the measurement systems 800 arranged in parallel, capacitance values of the capacitors 802 were 100 fF, 1 pF, and 3 pF.

Note that in the above-described measurement, VDD was 5 V and VSS was 0 V. In the measurement period, Vout was measured while the potential V1 was basically VSS and set to VDD only in a period of 100 milliseconds every 10 to 300 seconds. Moreover, Δt used in calculation of a current I which flows through the element was about 30000 seconds.

Figure 9:
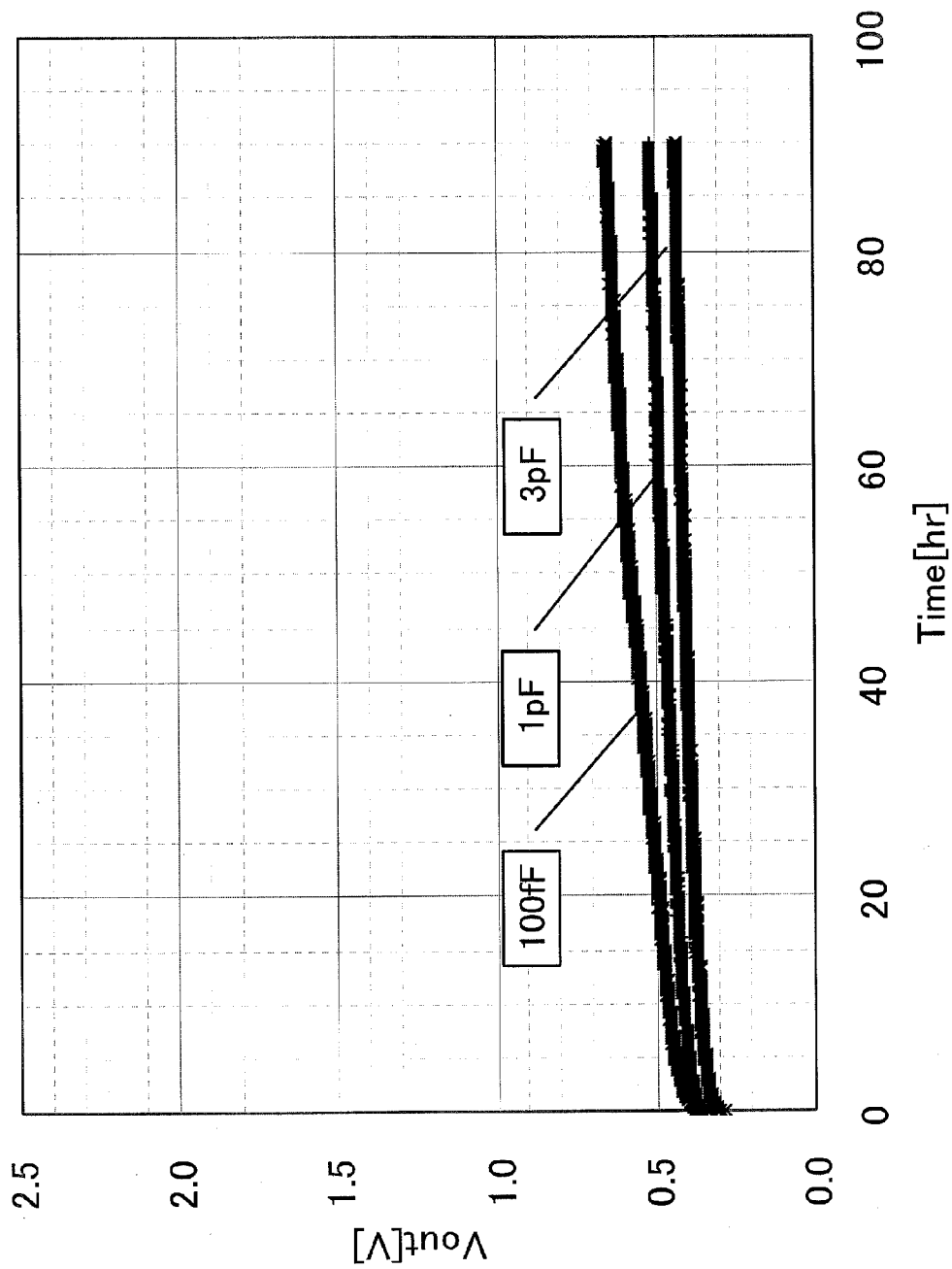
FIG. 9 shows characteristics of transistors.

FIG. 9 shows the relation between elapsed time Time in the current measurement and the output potential Vout. It can be seen from FIG. 9 that the potential is changed over time.

Figure 10:
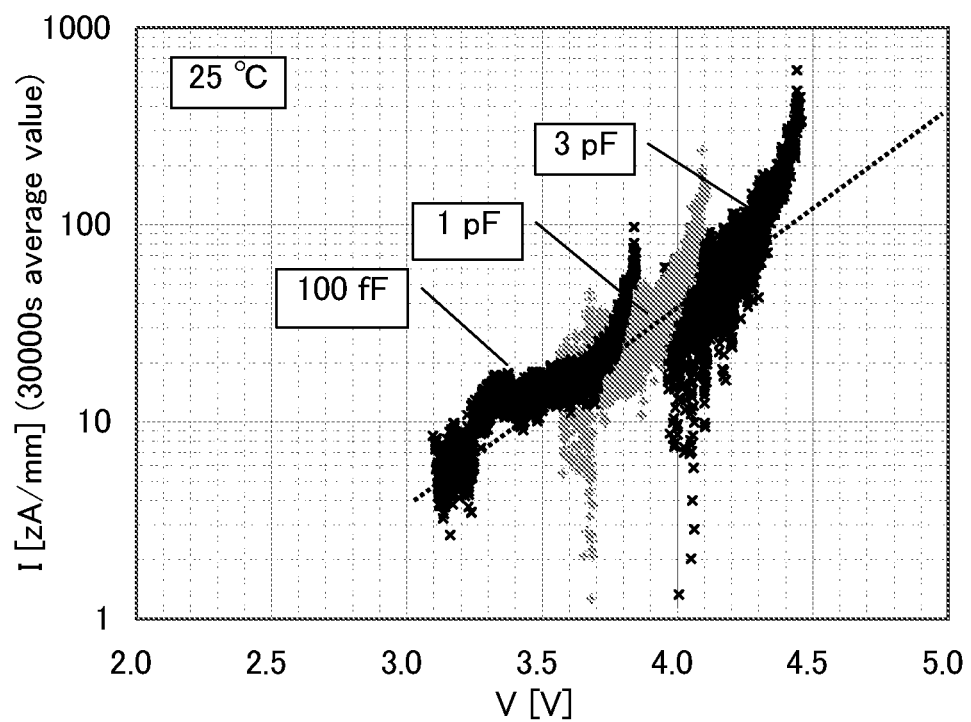
FIG. 10 shows characteristics of transistors.

FIG. 10 shows the off-state current at room temperature (25° C.) calculated in the above current measurement. FIG. 10 shows the relation between a source-drain voltage V of the transistor 804 or the transistor 808 and an off-state current I. It is found from FIG. 10 that the off-state current is about 40 zA/μm when the source-drain voltage is 4 V. In addition, the off-state current was 10 zA/μm or less when the source-drain voltage was 3.1 V. Note that 1 zA is $10^{-21}$ A.

Figure 11:
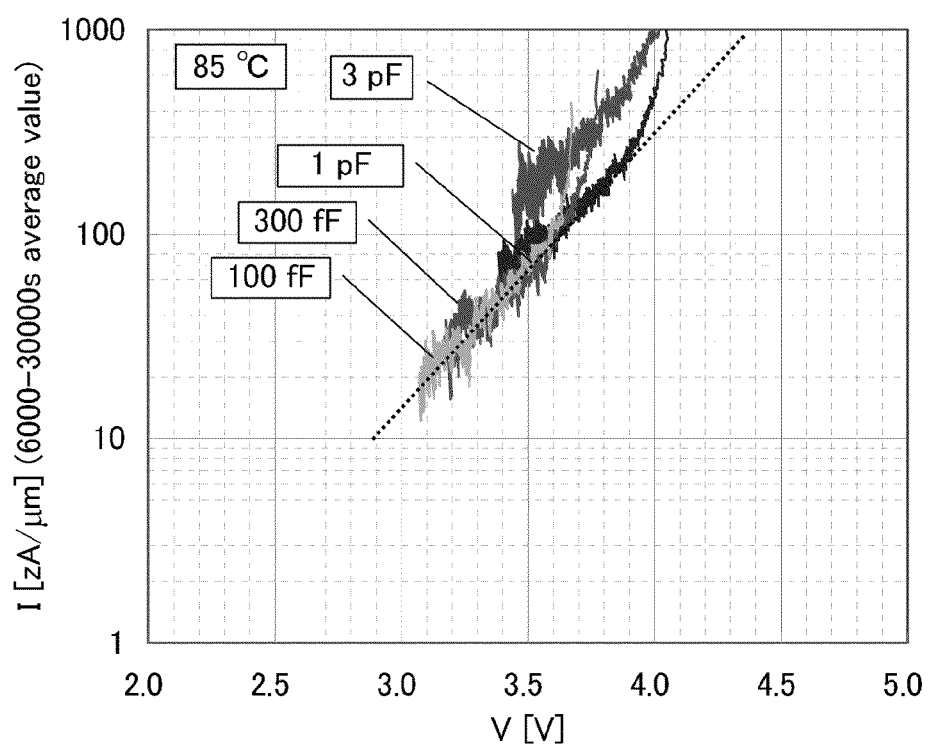
FIG. 11 shows characteristics of transistors.

FIG. 11 shows the off-state current at 85° C. calculated in the above current measurement. FIG. 11 shows the relation between a source-drain voltage V of the transistor 804 or the transistor 808 and an off-state current I at 85° C. It is found from FIG. 11 that the off-state current was 100 zA/μm or less when the source-drain voltage was 3.1 V.

As has been described above, it was confirmed that the off-state current was sufficiently small in a transistor including a purified oxide semiconductor layer.

(Variations of Display Device)

The display device having the above-described configuration is one embodiment of the present invention; the present invention also includes a display device that is different from the display device.

<Variations of Pulse Output Circuit>

Figure 12A:
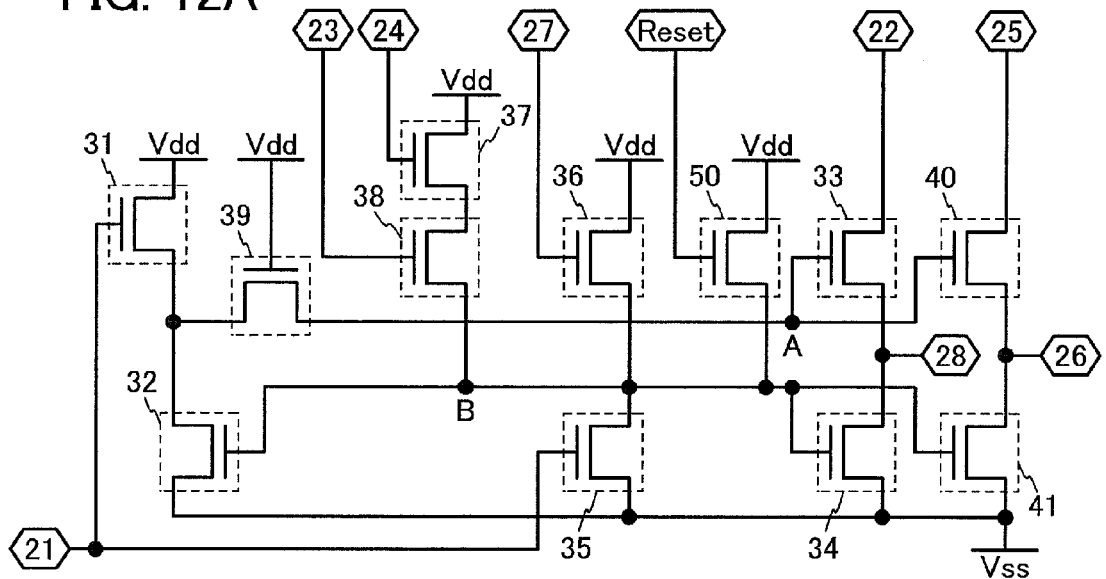
FIGS. 12A and 12B are circuit diagrams each illustrating an example of a pulse output circuit.

For example, the pulse output circuit can have a structure where a transistor 50 is additionally provided in the pulse output circuit illustrated in FIG. 3A (see FIG. 12A). One of a source and a drain of the transistor 50 is electrically connected to the high power supply potential line. The other of the source and the drain of the transistor 50 is electrically connected to the gate of the transistor 32, the gate of the transistor 34, the other of the source and the drain of the transistor 35, the other of the source and the drain of the transistor 36, one of the source and the drain of the transistor 38, and the gate of the transistor 41. A gate of the transistor 50 is electrically connected to a reset terminal (Reset). Note that to the reset terminal, a high-level potential is input in a vertical retrace period and a low-level potential is input in periods other than the vertical retrace period. In other words, the transistor 50 is turned on in the vertical retrace period. Thus, the potential of each node can be initialized in the vertical retrace period, so that malfunction can be prevented.

Figure 12B:
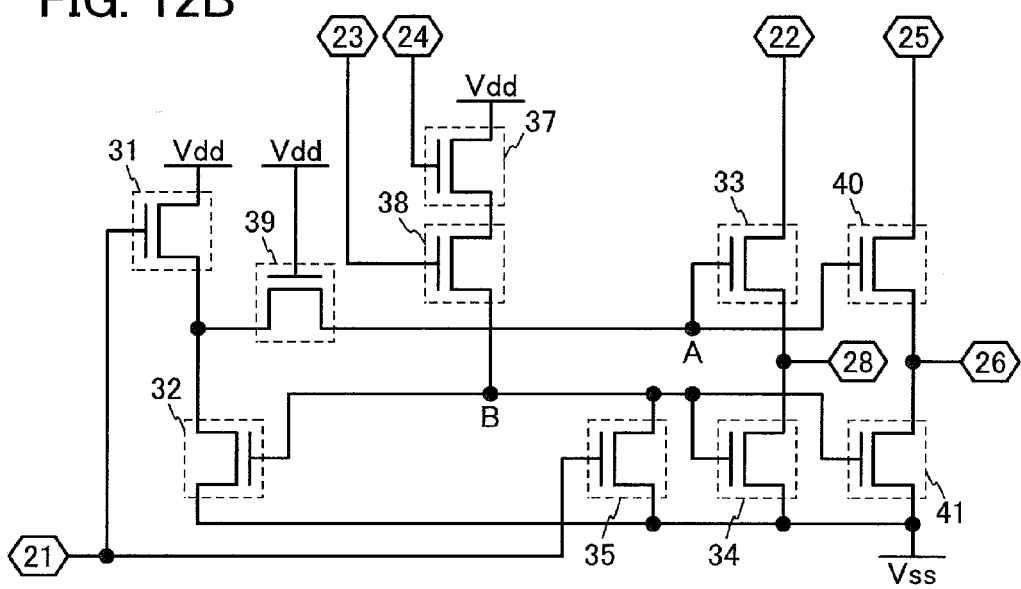

In addition, the pulse output circuit can have a structure in which the transistor 36 is omitted from the pulse output circuit illustrated in FIG. 3A (see FIG. 12B). With this structure, the number of transistors included in the pulse output circuit can be reduced. Thus, it is possible to realize reduction in layout area of the pulse output circuit, increase in yield, or the like.

Figure 13A:
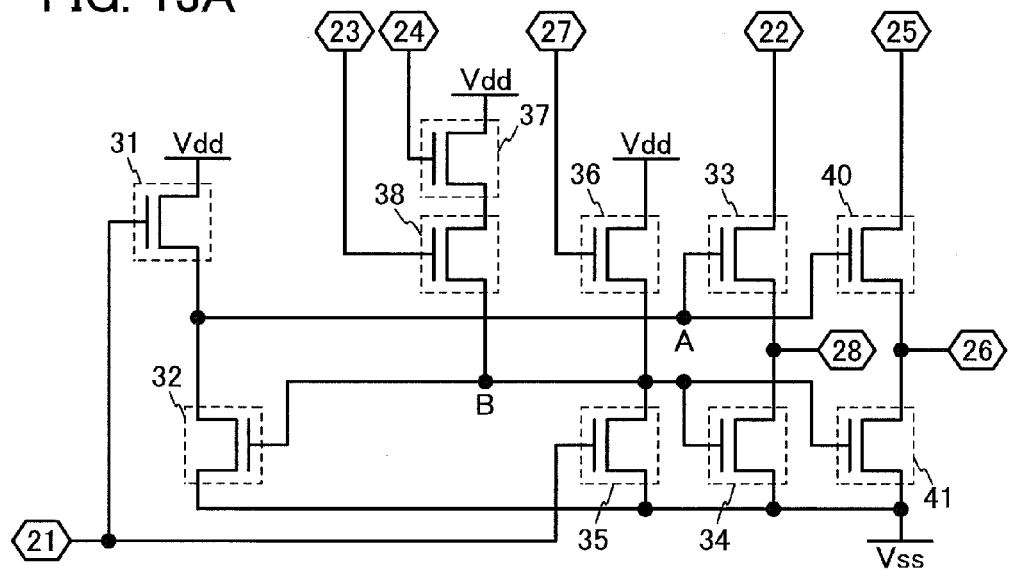
FIGS. 13A and 13B are circuit diagrams each illustrating an example of a pulse output circuit.

The pulse output circuit can have a structure in which the transistor 39 is omitted from the pulse output circuit illustrated in FIG. 3A (see FIG. 13A). With this structure, the number of transistors included in the pulse output circuit can be reduced. Thus, it is possible to realize reduction in layout area of the pulse output circuit, increase in yield, or the like.

Figure 13B:
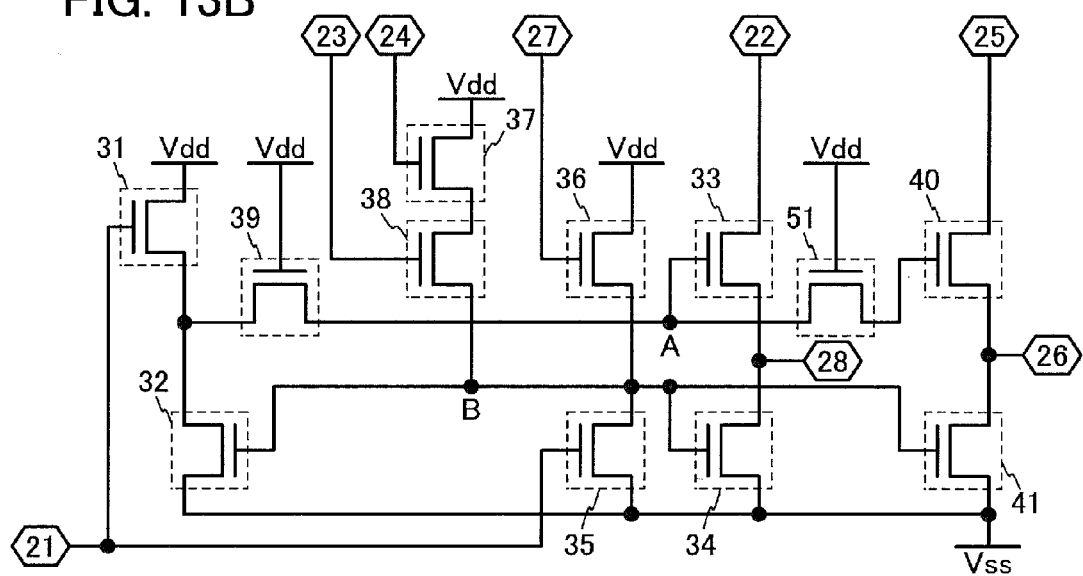

The pulse output circuit can have a structure where a transistor 51 is added to the pulse output circuit illustrated in FIG. 3A (see FIG. 13B). One of a source and a drain of the transistor 51 is electrically connected to the gate of the transistor 33 and the other of the source and the drain of the transistor 39. The other of the source and the drain of the transistor 51 is electrically connected to the gate of the transistor 40. A gate of the transistor 51 is electrically connected to the high power supply potential line. Note that the transistor 51 is off in the periods t2 and t3 illustrated in FIGS. 3B and 3C. For that reason, with the structure including the transistor 51, electrical connection between the gate of the transistor 33 and the gate of the transistor 40 can be broken in the periods t2 and t3. Below is comparison between the structure of the pulse output circuit including the transistor 51 (see FIG. 13B) and the structure without the transistor 51 (see FIG. 3A), and detailed description of advantages of the former structure.

First, the case where the transistor 51 is not provided will be described. In the case where a signal that repeats the high power supply potential (Vdd) and the low power supply potential (Vss) is input to the terminal 25, both an output signal of the terminal 28 and an output signal of the terminal 26 are the high power supply potential (Vdd) in the periods t2 and t3. At this time, the potential of the gates of the transistors 33 and 40 (the potential of the node A) is made higher than the high power supply potential (Vdd) by capacitive coupling of the source and the gate of the transistor 33 and capacitive coupling of the source and the gate of the transistor 40. On the other hand, in the case where a signal input to the terminal 25 is fixed at the low power supply potential (Vss), an output signal of the terminal 28 is the high power supply potential (Vdd) and an output signal of the terminal 26 is the low power supply potential (Vss) in the periods t2 and t3. At this time, the potential of the gates of the transistors 33 and 40 (the potential of the node A) needs to be made higher than the high power supply potential (Vdd) only by capacitive coupling of the source and the gate of the transistor 33. Moreover, the transistor 40 is often designed to have a larger channel width than the transistor 36 because a scan line is driven by the transistor 40. In other words, the gate of the transistor 40 serves as a large load when the potential is increased by the capacitive coupling. For that reason, the ratio of the channel width to the channel length (W/L) of the transistor 33 needs to be large in order to operate the pulse output circuit.

On the other hand, in the case where the transistor 51 is provided, electrical connection between the gate of the transistor 33 and the gate of the transistor 40 is broken in the periods t2 and t3. Therefore, only the potential of the gate of the transistor 33 can be increased by capacitive coupling. That is, the load in the capacitive coupling can be reduced. Thus, the pulse output circuit can be operated in a favorable manner. In addition, since the ratio of the channel width to the channel length (W/L) of the transistor 36 does not need to be large, the layout area can be reduced.

Figure 14A:
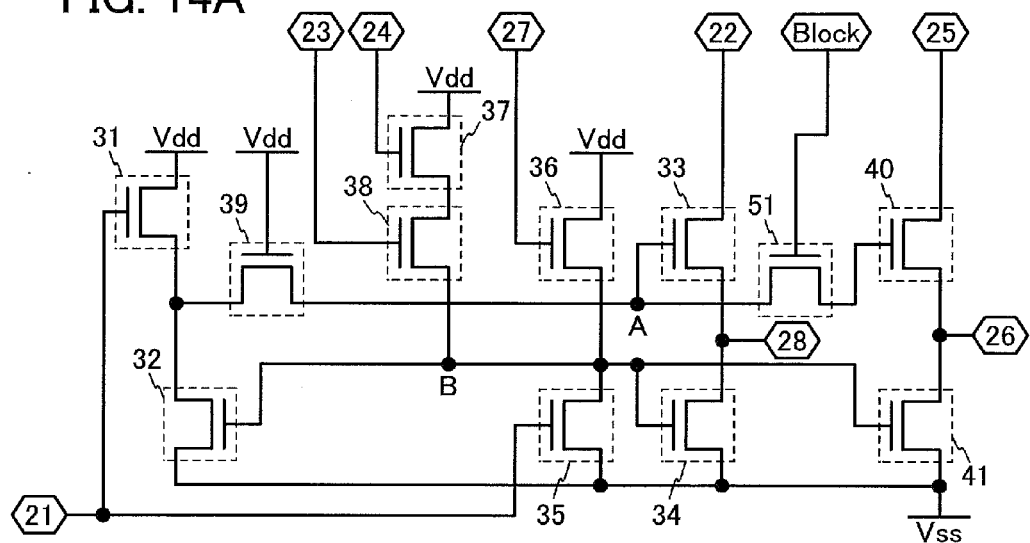
FIGS. 14A and 14B are circuit diagrams each illustrating an example of a pulse output circuit.
Figure 14B:
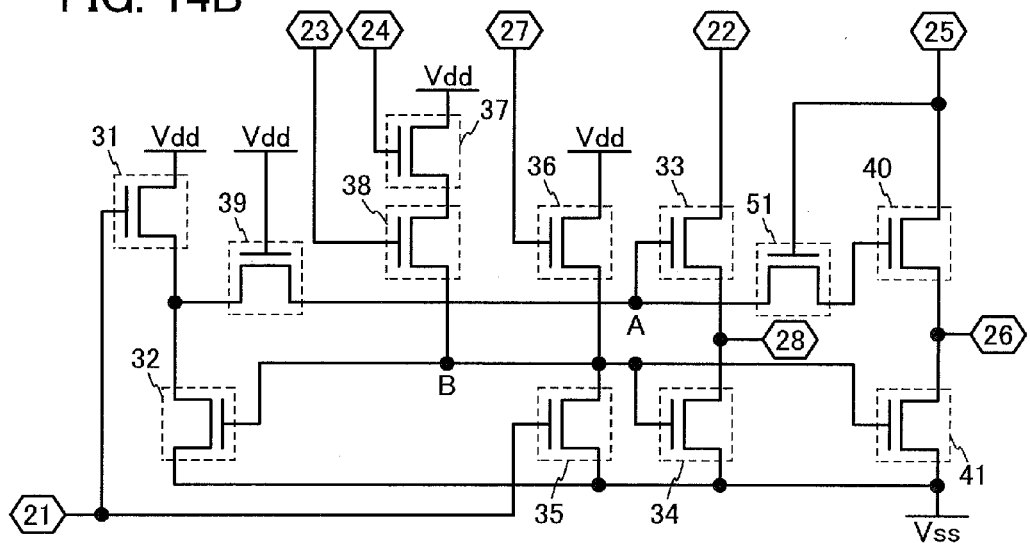

Note that FIG. 13B illustrates the structure in which the gate of the transistor 51 is electrically connected to the high power supply potential; alternatively, the gate of the transistor 51 can be connected to a block terminal (Block) (see FIG. 14A) or to the terminal 25 (see FIG. 14B). Note that to the block terminal (Block), it is preferable that a high-level potential be input when a signal that is the same as any one of the first to fourth clock signals (GCK1 to GCK4) is input to the terminal 25, and that a low-level potential be input when a fixed potential (the low power supply potential (Vss)) is input to the terminal 25. In other words, the transistor 51 is controlled to be turned on when a signal that is the same as any one of the first to fourth clock signals (GCK1 to GCK4) is input to the terminal 25, and controlled to be turned off when the fixed potential (the low power supply potential (Vss)) is input to the terminal 25. Thus, the timing of breaking the electrical connection between the gate of the transistor 33 and the gate of the transistor 40 can be advanced. Further, the structure in which the gate of the transistor 51 is electrically connected to the terminal 25 (see FIG. 14B) is preferable in that there is no need for an additional signal.

<Variations of Transistor>

In any of the above-described display devices, the transistor 211 with a bottom-gate structure called a channel-etch structure (see FIG. 5) is used as the transistor 17 provided in the pixel 16; however, the transistor 17 is not limited to having this structure. Transistors illustrated in FIGS. 15A to 15C can be used, for example.

Figure 15A:
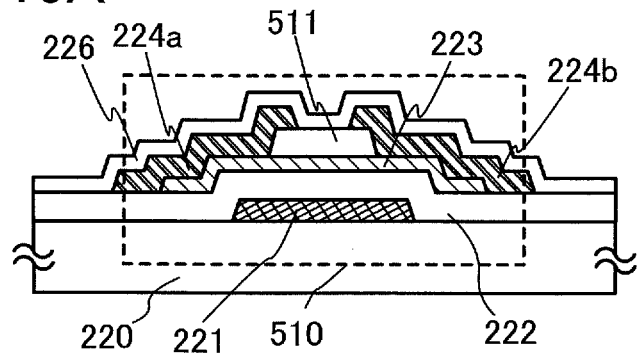
FIGS. 15A to 15C are cross-sectional views each illustrating an example of a transistor.

A transistor 510 illustrated in FIG. 15A has a kind of bottom-gate structure called a channel-protective type (channel-stop type).

The transistor 510 includes, over a substrate 220 having an insulating surface, a gate layer 221, a gate insulating layer 222, an oxide semiconductor layer 223, an insulating layer 511 functioning as a channel protective layer that covers a channel formation region of the oxide semiconductor layer 223, a source layer 224a, and a drain layer 224b. Moreover, a protective insulating layer 226 is formed to cover the source layer 224a, the drain layer 224b, and the insulating layer 511.

Figure 15B:
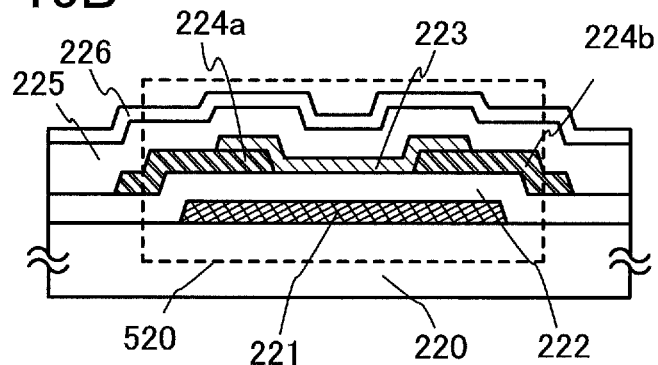

A transistor 520 illustrated in FIG. 15B is a bottom-gate transistor. The transistor 520 includes, over a substrate 220 having an insulating surface, a gate layer 221, a gate insulating layer 222, a source layer 224a, a drain layer 224b, and an oxide semiconductor layer 223. Furthermore, an insulating layer 225 that covers the source layer 224a and the drain layer 224b and is in contact with the oxide semiconductor layer 223 is provided. A protective insulating layer 226 is provided over the insulating layer 225.

In the transistor 520, the gate insulating layer 222 is provided on and in contact with the substrate 220 and the gate layer 221, and the source layer 224a and the drain layer 224b are provided on and in contact with the gate insulating layer 222. Further, the oxide semiconductor layer 223 is provided over the gate insulating layer 222, the source layer 224a, and the drain layer 224b.

Figure 15C:
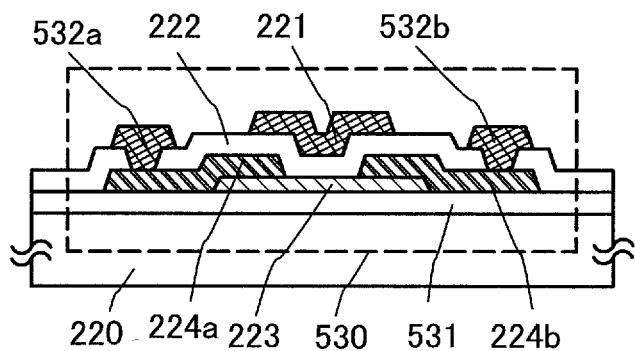

A transistor 530 illustrated in FIG. 15C is a kind of top-gate transistor. The transistor 530 includes, over a substrate 220 having an insulating surface, an insulating layer 531, an oxide semiconductor layer 223, a source layer 224a and a drain layer 224b, a gate insulating layer 222, and a gate layer 221. A wiring layer 532a and a wiring layer 532b are provided in contact with the source layer 224a and the drain layer 224b, to be electrically connected to the source layer 224a and the drain layer 224b, respectively.

As the insulating layers 511 and 531, an inorganic insulating film typified by a silicon oxide film, a silicon oxynitride film, an aluminum oxide film, or an aluminum oxynitride film can be used. Moreover, a conductive film used for the wiring layers 532a and 532b can be formed using an element selected from Al, Cr, Cu, Ta, Ti, Mo, and W, an alloy including any of these elements as a component, or an alloy film including a combination of any of these elements, for example. A structure may be employed in which a high-melting-point metal layer of Ti, Mo, W, or the like is stacked on one or both of a top surface and a bottom surface of a metal layer of Al, Cu, or the like. By using an aluminum material to which an element preventing generation of hillocks and whiskers in an aluminum film (e.g., Si, Nd, or Sc) is added, heat resistance can be increased.

(Various Electronic Devices Including Display Device)

Examples of electronic devices including any of the display devices disclosed in this specification will be described below with reference to FIGS. 16A to 16F.

Figure 16A:
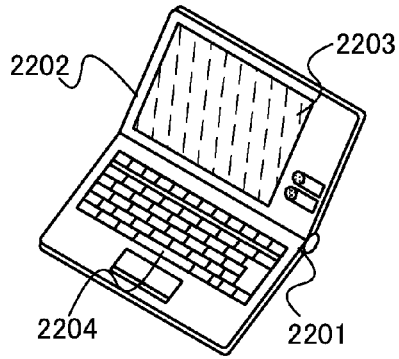
FIGS. 16A to 16F each illustrate an example of an electronic device.

FIG. 16A illustrates a notebook personal computer including a main body 2201, a housing 2202, a display portion 2203, a keyboard 2204, and the like.

Figure 16B:
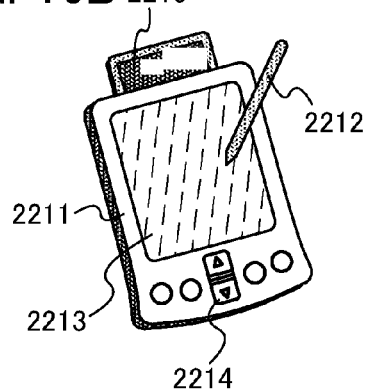

FIG. 16B illustrates a personal digital assistant (PDA). A main body 2211 is provided with a display portion 2213, an external interface 2215, operation buttons 2214, and the like. A stylus 2212 is provided as an accessory for operating the PDA.

Figure 16C:
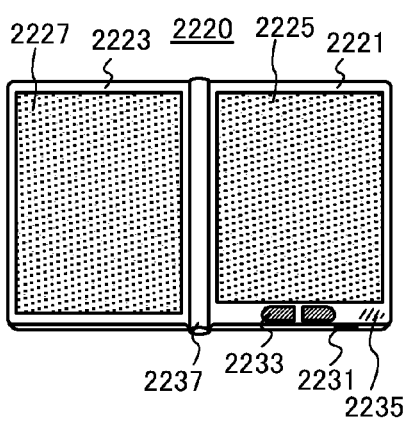

FIG. 16C illustrates an e-book reader 2220 as an example of electronic paper. The e-book reader 2220 includes two housings of a housing 2221 and a housing 2223. The housings 2221 and 2223 are united with an axis portion 2237, along which the e-book reader 2220 can be opened and closed. With such a structure, the e-book reader 2220 can be used like a paper book.

A display portion 2225 is incorporated in the housing 2221, and a display portion 2227 is incorporated in the housing 2223. The display portion 2225 and the display portion 2227 may display one image or different images. In the case where the display portions 2225 and 2227 display different images, for example, the right display portion (the display portion 2225 in FIG. 16C) can display text and the left display portion (the display portion 2227 in FIG. 16C) can display pictures.

Further, in FIG. 16C, the housing 2221 is provided with an operation portion and the like. For example, the housing 2221 is provided with a power switch 2231, an operation key 2233, and a speaker 2235. Pages can be turned with the operation key 2233. Note that a keyboard, a pointing device, or the like may also be provided on the surface of the housing, on which the display portion is provided. An external connection terminal (e.g., an earphone terminal, a USB terminal, or a terminal that can be connected to an AC adapter or various cables such as a USB cable), a recording medium insertion portion, and the like may be provided on the back surface or the side surface of the housing. Further, the e-book reader 2220 may have a function of an electronic dictionary.

The e-book reader 2220 may be configured to transmit and receive data wirelessly. Through wireless communication, desired book data or the like can be purchased and downloaded from an e-book server.

Note that electronic paper can be applied to devices in a variety of fields as long as they display data. For example, electronic paper can be used for posters, advertisement in vehicles such as trains, and display in a variety of cards such as credit cards in addition to e-book readers.

Figure 16D:
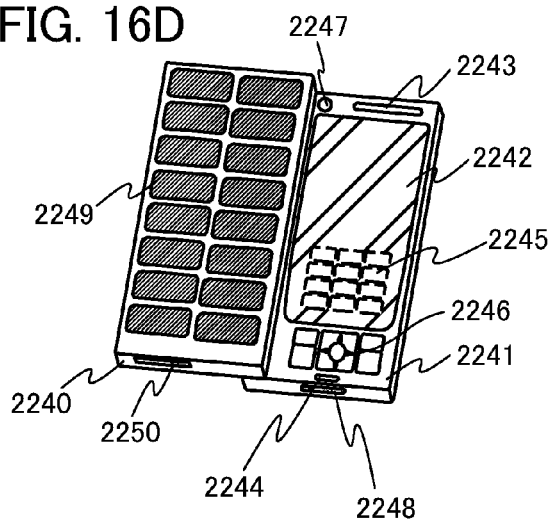

FIG. 16D illustrates a mobile phone. The mobile phone includes two housings of a housing 2240 and a housing 2241. The housing 2241 is provided with a display panel 2242, a speaker 2243, a microphone 2244, a pointing device 2246, a camera lens 2247, an external connection terminal 2248, and the like. The housing 2240 is provided with a solar cell 2249 for charging the mobile phone, an external memory slot 2250, and the like. An antenna is incorporated in the housing 2241.

The display panel 2242 has a touch panel function. In FIG. 16D, a plurality of operation keys 2245 displayed as images are shown by dashed lines. Note that the mobile phone includes a booster circuit for increasing a voltage output from the solar cell 2249 to a voltage needed for each circuit. Moreover, the mobile phone can include a contactless IC chip, a small recording device, or the like in addition to the above components.

The display orientation of the display panel 2242 changes as appropriate in accordance with the application mode. Further, the camera lens 2247 is provided on the same surface as the display panel 2242, so that the mobile phone can be used as a video phone. The speaker 2243 and the microphone 2244 can be used for videophone calls, recording, playing sound, and the like as well as voice calls. The housings 2240 and 2241 which are unfolded as illustrated in FIG. 16D can slide so that one overlaps the other. Thus, the size of the mobile phone can be reduced, which makes the mobile phone suitable for being carried.

The external connection terminal 2248 can be connected to an AC adapter or a variety of cables such as a USB cable, which enables charging of the mobile phone and data communication. Moreover, a larger amount of data can be saved and moved by inserting a recording medium to the external memory slot 2250. Further, the mobile phone may have an infrared communication function, a television reception function, or the like in addition to the above functions.

Figure 16E:
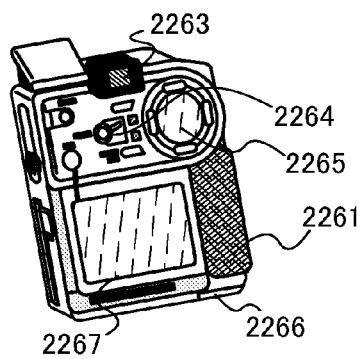

FIG. 16E illustrates a digital camera. The digital camera includes a main body 2261, a display portion (A) 2267, an eyepiece 2263, an operation switch 2264, a display portion (B) 2265, a battery 2266, and the like.

Figure 16F:
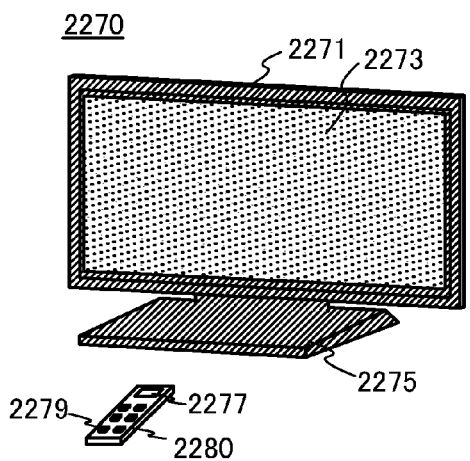

FIG. 16F illustrates a television set. In a television set 2270, a display portion 2273 is incorporated in a housing 2271. The display portion 2273 can display images. Here, the housing 2271 is supported by a stand 2275.

The television set 2270 can be operated by an operation switch of the housing 2271 or a separate remote controller 2280. With operation keys 2279 of the remote controller 2280, channels and volume can be controlled and an image displayed on the display portion 2273 can be controlled. Moreover, the remote controller 2280 may have a display portion 2277 that displays data output from the remote controller 2280.

Note that the television set 2270 is preferably provided with a receiver, a modem, and the like. A general television broadcast can be received with the receiver. Moreover, when the television set is connected to a communication network with or without wires via the modem, one-way (from a sender to a receiver) or two-way (between a sender and a receiver or between receivers) data communication can be performed.

This application is based on Japanese Patent Application serial no. 2010-056464 filed with Japan Patent Office on Mar. 12, 2010, the entire contents of which are hereby incorporated by reference.

The invention claimed is:

1. A display device comprising:
a plurality of pixels;
first to m-th scan lines (m is a natural number) electrically connected to n pixels in respective first to m-th rows, among the plurality of pixels; and
first to m-th pulse output circuits electrically connected to the respective first to m-th scan lines,
wherein the k-th pulse output circuit (k is a natural number greater than or equal to 2 and less than m) includes:
a first transistor having one of a source and a drain electrically connected to a first wiring for supplying a clock signal, and the other of the source and the drain electrically connected to the (k+1)th pulse output circuit,
a second transistor having one of a source and a drain electrically connected to a second wiring for supplying the clock signal or a first fixed potential, and the other of the source and the drain electrically connected to the k-th scan line, and a control circuit configured to control a potential of a gate of the first transistor and a potential of a gate of the second transistor in accordance with a signal input from the (k−1)th pulse output circuit, wherein the control circuit includes a third transistor having one of a source and a drain electrically connected to the gate of the first transistor, and the other of the source and the drain electrically connected to the gate of the second transistor.

2. The display device according to claim 1,
wherein a gate of the third transistor is electrically connected to a wiring for supplying a second fixed potential which is different from the first fixed potential.

3. The display device according to claim 1,
wherein the third transistor is turned on in a period during which the second wiring supplies the clock signal.

4. The display device according to claim 1,
wherein a gate of the third transistor is electrically connected to the second wiring.

5. The display device according to claim 1,
wherein the k-th scan line is connected to a gate of a transistor provided in each of the pixels of the k-th row.

6. The display device according to claim 1,
wherein the k-th scan line is connected to a gate of a transistor provided in each of the pixels of the k-th row, and
wherein one of a source and a drain of the transistor provided in each of the pixels of the k-th row is electrically connected to a signal line, and a liquid crystal element is connected to the other of the source and the drain of the transistor provided in each of the pixels of the k-th row.

7. The display device according to claim 1, further comprising a display control circuit for selectively supplying the clock signal and the first fixed potential to the second wiring in accordance with an image signal in a partial driving mode.

8. A display device comprising:
a plurality of pixels;
first to m-th scan lines (m is a natural number) electrically connected to n pixels in respective first to m-th rows, among the plurality of pixels; and
first to m-th pulse output circuits electrically connected to the respective first to m-th scan lines,
wherein the k-th pulse output circuit (k is a natural number greater than or equal to 2 and less than m) includes:
a first transistor having one of a source and a drain electrically connected to a first wiring for supplying a clock signal, and the other of the source and the drain electrically connected to the (k+1)th pulse output circuit,
a second transistor having one of a source and a drain electrically connected to a second wiring for supplying the clock signal or a first fixed potential, and the other of the source and the drain electrically connected to the k-th scan line,
a third transistor having one of a source and a drain electrically connected to a wiring for supplying a second fixed potential, and the other of the source and the drain electrically connected to the other of the source and the drain of the first transistor and the (k+1)th pulse output circuit,
a fourth transistor having one of a source and a drain electrically connected to the wiring for supplying the second fixed potential, and the other of the source and the drain electrically connected to the other of the source and the drain of the second transistor and the k-th scan line, and
a control circuit configured to control potentials of gates of the first to fourth transistors in accordance with a signal input from the (k−1)th pulse output circuit, wherein the control circuit includes a fifth transistor having one of a source and a drain electrically connected to the gate of the first transistor, and the other of the source and the drain electrically connected to the gate of the second transistor.

9. The display device according to claim 8,
wherein the control circuit includes a reset transistor having one of a source and a drain electrically connected to a wiring for supplying a third fixed potential higher than the first fixed potential, and the other of the source and the drain electrically connected to the gate of the third transistor and the gate of the fourth transistor, and
wherein the reset transistor is turned on in a vertical retrace period.

10. The display device according to claim 8,
wherein a gate of the fifth transistor is electrically connected to a wiring for supplying a third fixed potential which is higher than the second fixed potential.

11. The display device according to claim 9,
wherein a gate of the fifth transistor is electrically connected to the wiring for supplying the third fixed potential.

12. The display device according to claim 8,
wherein the fifth transistor is turned on in a period during which the second wiring supplies the clock signal.

13. The display device according to claim 9,
wherein the fifth transistor is turned on in a period during which the second wiring supplies the clock signal.

14. The display device according to claim 8,
wherein a gate of the fifth transistor is electrically connected to the second wiring.

15. The display device according to claim 9,
wherein a gate of the fifth transistor is electrically connected to the second wiring.

16. The display device according to claim 8,
wherein the k-th scan line is connected to a gate of a transistor provided in each of the pixels of the k-th row.

17. The display device according to claim 8,
wherein the k-th scan line is connected to a gate of a transistor provided in each of the pixels of the k-th row, and
wherein one of a source and a drain of the transistor provided in each of the pixels of the k-th row is electrically connected to a signal line, and a liquid crystal element is connected to the other of the source and the drain of the transistor provided in each of the pixels of the k-th row.

18. The display device according to claim 8,
wherein a gate of the fifth transistor is electrically connected to a wiring for supplying a third fixed potential which is higher than the first fixed potential.

19. The display device according to claim 8, further comprising a display control circuit for selectively supplying the clock signal and the first fixed potential to the second wiring in accordance with an image signal in a partial driving mode.

20. A display device comprising:
a plurality of pixels;
first to m-th scan lines (m is a natural number) electrically connected to n pixels in respective first to m-th rows, among the plurality of pixels; and
first to m-th pulse output circuits electrically connected to the respective first to m-th scan lines, wherein the k-th pulse output circuit (k is a natural number greater than or equal to 2 and less than m) includes:

a first transistor having one of a source and a drain electrically connected to a first wiring for supplying a clock signal, and the other of the source and the drain electrically connected to the (k+1)th pulse output circuit, a second transistor having one of a source and a drain electrically connected to a second wiring for supplying the clock signal or a first fixed potential, and the other of the source and the drain electrically connected to the k-th scan line, and a control circuit configured to control a potential of a gate of the first transistor and a potential of a gate of the second transistor in accordance with a signal input from the (k−1)th pulse output circuit, wherein the control circuit includes a third transistor having one of a source and a drain electrically connected to the gate of the first transistor, the other of the source and the drain electrically connected to the gate of the second transistor, and a gate electrically connected to a wiring for supplying a second fixed potential which is higher than the first fixed potential.

21. The display device according to claim 20, wherein the k-th scan line is connected to a gate of a transistor provided in each of the pixels of the k-th row.

22. The display device according to claim 20, wherein the k-th scan line is connected to a gate of a transistor provided in each of the pixels of the k-th row, and wherein one of a source and a drain of the transistor provided in each of the pixels of the k-th row is electrically connected to a signal line, and a liquid crystal element is connected to the other of the source and the drain of the transistor provided in each of the pixels of the k-th row.

23. The display device according to claim 20, further comprising a display control circuit for selectively supplying the clock signal and the first fixed potential to the second wiring in accordance with an image signal in a partial driving mode.

* * * * *